(12) United States Patent
Cheng

(10) Patent No.: US 11,515,337 B2
(45) Date of Patent: Nov. 29, 2022

(54) ARRAY SUBSTRATE, DISPLAY APPARATUS, AND METHOD OF FABRICATING ARRAY SUBSTRATE

(71) Applicants: Beijing BOE Technology Development Co., Ltd., Beijing (CN); BOE Technology Group Co., Ltd., Beijing (CN)

(72) Inventor: Hongfei Cheng, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 37 days.

(21) Appl. No.: 16/771,038

(22) PCT Filed: Jun. 25, 2019

(86) PCT No.: PCT/CN2019/092746
§ 371 (c)(1),
(2) Date: Jun. 9, 2020

(87) PCT Pub. No.: WO2020/258023
PCT Pub. Date: Dec. 30, 2020

(65) Prior Publication Data
US 2021/0408056 A1  Dec. 30, 2021

(51) Int. Cl.
*H01L 27/12* (2006.01)
(52) U.S. Cl.
CPC ........ *H01L 27/124* (2013.01); *H01L 27/1259* (2013.01)

(58) Field of Classification Search
CPC .................. H01L 27/124; G02F 1/136286
See application file for complete search history.

(56) References Cited

FOREIGN PATENT DOCUMENTS

| CN | 1556437 A | * 12/2004 | ....... H01L 29/41733 |
| CN | 101866918 A | * 10/2010 | |
| KR | 20060131025 A | * 12/2006 | ....... G02F 1/136286 |
| KR | 20080006891 A | * 1/2008 | ........... G02F 1/1368 |

* cited by examiner

*Primary Examiner* — Peter M Albrecht
(74) *Attorney, Agent, or Firm* — Intellectual Valley Law, P.C.

(57) ABSTRACT

An array substrate having a plurality of subpixels is provided. In a respective one of the plurality of subpixels, the array substrate includes a base substrate; and a thin film transistor on the base substrate. The thin film transistor includes a gate electrode, a source electrode, and a drain electrode. The drain electrode includes a first portion, a second portion, and a third portion connecting the first portion and the second portion. An orthographic projection of the first portion on the base substrate at least partially overlaps with an orthographic projection of a first gate line protrusion of a respective one of the plurality of gate lines on the base substrate. An orthographic projection of the second portion on the base substrate at least partially overlaps with an orthographic projection of a second gate line protrusion of the respective one of the plurality of gate lines on the base substrate.

17 Claims, 13 Drawing Sheets

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2019/092746, filed Jun. 25, 2019, the contents of which are incorporated by reference in the entirety.

TECHNICAL FIELD

The present invention relates to display technology, more particularly, to an array substrate, a display apparatus, and a method of fabricating an array substrate.

BACKGROUND

Display apparatuses such as liquid crystal display (LCD) apparatuses and organic light-emitting diode (OLED) display apparatuses have been widely used. LCD and OLED display apparatuses use a thin film transistor (TFT) to control pixels in the display panel. Examples of TFT include amorphous silicon TFT, polycrystalline silicone TFT, single crystal silicon TFT, and metal oxide TFT. Characteristics and performance of the thin film transistor affect the display quality of the display panel.

SUMMARY

In one aspect, the present invention provides an array substrate having a plurality of subpixels, comprising a plurality of gate lines and a plurality of data lines crossing over each other; wherein, in a respective one of the plurality of subpixels, the array substrate comprises a base substrate; and a thin film transistor on the base substrate, and comprises a gate electrode, a source electrode, and a drain electrode; wherein the drain electrode comprises a first portion, a second portion, and a third portion connecting the first portion and the second portion; an orthographic projection of the first portion on the base substrate at least partially overlaps with an orthographic projection of a first gate line protrusion of a respective one of the plurality of gate lines on the base substrate; an orthographic projection of the second portion on the base substrate at least partially overlaps with an orthographic projection of a second gate line protrusion of the respective one of the plurality of gate lines on the base substrate; and an orthographic projection of the third portion on the base substrate is non-overlapping with an orthographic projection of the plurality of gate lines on the base substrate.

Optionally, the second gate line protrusion has a margin along a direction from the first gate line protrusion to the second gate line protrusion; the margin abuts an overlapping portion of the second gate line protrusion, wherein an orthographic projection of the overlapping portion of the second gate line protrusion on the base substrate overlaps with the orthographic projection of the second portion on the base substrate; and the overlapping portion of the second gate line protrusion and the margin are arranged along the direction from the first gate line protrusion to the second gate line protrusion.

Optionally, the plurality of gate lines are arranged along a first direction; the plurality of data lines are arranged along a second direction; and the direction from the first gate line protrusion to the second gate line protrusion is substantially parallel to one of the first direction and the second direction.

Optionally, the thin film transistor further comprises an active layer; the first gate line protrusion comprises a gate electrode as an integral portion; an orthographic projection of the gate electrode on the base substrate at least partially overlaps with an orthographic projection of the active layer on the base substrate; and the orthographic projection of the second gate line protrusion on the base substrate is non-overlapping with the orthographic projection of the active layer on the base substrate.

Optionally, the drain electrode further comprises a fourth portion and a fifth portion; wherein an orthographic projection of the fourth portion on the base substrate at least partially overlaps with an orthographic projection of a third gate line protrusion of the respective one of the plurality of gate lines on the base substrate; and an orthographic projection of the fifth portion on the base substrate is non-overlapping with the orthographic projection of the plurality of gate lines on the base substrate.

Optionally, the second gate line protrusion has a first margin along a direction from the first gate line protrusion to the second gate line protrusion; the third gate line protrusion has a second margin along a direction from the first gate line protrusion to the third gate line protrusion; the first margin abuts a first overlapping portion of the second gate line protrusion, wherein an orthographic projection of the first overlapping portion of the second gate line protrusion on the base substrate overlaps with the orthographic projection of the second portion on the base substrate; the second margin abuts a second overlapping portion of the third gate line protrusion, wherein an orthographic projection of the second overlapping portion of the third gate line protrusion on the base substrate overlaps with the orthographic projection of the fourth portion on the base substrate; the first overlapping portion of the second gate line protrusion and the first margin are arranged along the direction from the first gate line protrusion to the second gate line protrusion; and the second overlapping portion of the third gate line protrusion and the second margin are arranged along the direction from the first gate line protrusion to the third gate line protrusion.

Optionally, the plurality of gate lines are arranged along a first direction; the plurality of data lines are arranged along a second direction; the direction from the first gate line protrusion to the second gate line protrusion is substantially parallel to the first direction; and the direction from the first gate line protrusion to the third gate line protrusion is substantially parallel to the second direction.

Optionally, the thin film transistor further comprises an active layer; the first gate line protrusion comprises a gate electrode as an integral portion; an orthographic projection of the gate electrode on the base substrate at least partially overlaps with an orthographic projection of the active layer on the base substrate; and orthographic projections of the second gate line protrusion and the third gate line protrusion on the base substrate are non-overlapping with the orthographic projection of the active layer on the base substrate.

Optionally, in the respective one of the plurality of subpixels, the array substrate further comprises a pixel electrode; and a passivation layer between the pixel electrode and the drain electrode; wherein the pixel electrode extends through the passivation layer to electrically connected to the third portion of the drain electrode.

Optionally, in the respective one of the plurality of subpixels, the array substrate further comprises a pixel electrode; and a passivation layer between the pixel electrode and the drain electrode; wherein the pixel electrode extends through the passivation layer to electrically connected to the second portion of the drain electrode.

Optionally, in the respective one of the plurality of subpixels, the array substrate further comprises a pixel electrode; and a passivation layer between the pixel electrode and the drain electrode; wherein the pixel electrode extends through the passivation layer to electrically connected to the third portion of the drain electrode and the fifth portion of the drain electrode, respectively.

Optionally, an orthographic projection of the source electrode on the base substrate at least partially overlaps with the orthographic projection of the first gate line protrusion on the base substrate, and is non-overlapping with the orthographic projection of the second gate line protrusion on the base substrate.

Optionally, the first gate line protrusion, the second gate line protrusion, and a main body of the respective one of the plurality of gate lines on the base substrate are parts of a unitary structure; the first gate line protrusion and the second gate line protrusion are respectively connected to the main body of the respective one of the plurality of gate lines; and the first gate line protrusion and the second gate line protrusion are spaced apart by a gap.

Optionally, the third portion is at least partially in a region corresponding to the gap.

Optionally, the first gate line protrusion, the second gate line protrusion, the third gate line protrusion, and a main body of the respective one of the plurality of gate lines on the base substrate are parts of a unitary structure; the first gate line protrusion, the second gate line protrusion, and the third gate line protrusion are respectively connected to the main body of the respective one of the plurality of gate lines; the first gate line protrusion and the second gate line protrusion are spaced apart by a first gap; and the first gate line protrusion and the third gate line protrusion are spaced apart by a second gap.

Optionally, the third portion is at least partially in a region corresponding to the first gap; and the fifth portion is at least partially in a region corresponding to the second gap.

In another aspect, the present invention provides a display apparatus, comprising the array substrate described herein or fabricated by a method described herein, and one or more integrated circuits connected to the array substrate.

In another aspect, the present invention provides a method of fabricating an array substrate having a plurality of subpixels, comprising forming a plurality of gate lines and a plurality of data lines crossing over each other; wherein, in a respective one of the plurality of subpixels, the method comprises forming a thin film transistor on the base substrate; wherein forming the thin film transistor comprises forming a gate electrode, forming a source electrode, and forming a drain electrode; wherein the drain electrode is formed to comprise a first portion, a second portion, and a third portion connecting the first portion and the second portion; an orthographic projection of the first portion on the base substrate at least partially overlaps with an orthographic projection of a first gate line protrusion of a respective one of the plurality of gate lines on the base substrate, resulting in a first overlapping area; an orthographic projection of the second portion on the base substrate at least partially overlaps with an orthographic projection of a second gate line protrusion of the respective one of the plurality of gate lines on the base substrate, resulting in a second overlapping area; and an orthographic projection of the third portion on the base substrate is non-overlapping with an orthographic projection of the plurality of gate lines on the base substrate.

In another aspect, the present invention provides a method of fabricating a first array substrate and a second array substrate, each of which is fabricated according to the method described herein; wherein a mask plate for patterning the drain electrode is aligned at a first position during fabricating the first array substrate, and is aligned at a second position during fabricating the second array substrate; the second position is different from the first position and is offset from the first position by a distance equal to or smaller than a threshold value; and a total overlapping area comprising the first overlapping area and the second overlapping area is substantially the same during fabricating the first array substrate and during fabricating the second array substrate.

Optionally, in the first array substrate, the second gate line protrusion has a margin along a direction from the first gate line protrusion to the second gate line protrusion; the margin abuts an overlapping portion of the second gate line protrusion, wherein an orthographic projection of the overlapping portion of the second gate line protrusion on the base substrate overlaps with the orthographic projection of the second portion on the base substrate; the overlapping portion of the second gate line protrusion and the margin are arranged along the direction from the first gate line protrusion to the second gate line protrusion; and the threshold value is a length of the margin along the direction from the first gate line protrusion to the second gate line protrusion.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional array substrate, a drain electrode, a gate insulating layer, and a gate electrode of a thin film transistor form a parasitic capacitance. The thin film transistor is designed to have certain characteristics, with the consideration of the above mentioned parasitic capacitance. However, in fabricating the array substrate, alignment errors exist in aligning various mask plates for fabricating components of the array substrate. For example, an alignment error in aligning a mask plate for fabricating the drain electrode would result in a relative positional shift between the drain electrode and the gate electrode, leading to a change in the above mentioned parasitic capacitance. Because the parasitic capacitance deviates from the value used in designing the thin film transistor, the relative positional shift results in changes in characteristics of the thin film transistor, adversely affecting display quality of a display panel having the array substrate.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate having a plurality of subpixels. The array substrate includes a plurality of gate lines and a plurality of data lines crossing over each other. In some embodiments, in a respective one of the plurality of subpixels, the array substrate includes a base substrate; and a thin film transistor on the base substrate. The thin film transistor includes a gate electrode, a source electrode, and a drain electrode. Optionally, the drain electrode includes a first portion, a second portion, and a third portion connecting the first portion and the second portion. Optionally, an orthographic projection of the first portion on the base substrate at least partially overlaps with an orthographic projection of a first gate line protrusion of a respective one of the plurality of gate lines on the base substrate. Optionally, an orthographic projection of the second portion on the base substrate at least partially overlaps with an orthographic projection of a second gate line protrusion of the respective one of the plurality of gate lines on the base substrate. Optionally, an orthographic projection of the third portion on the base substrate is non-overlapping with an orthographic projection of the plurality of gate lines on the base substrate.

Figure 1:
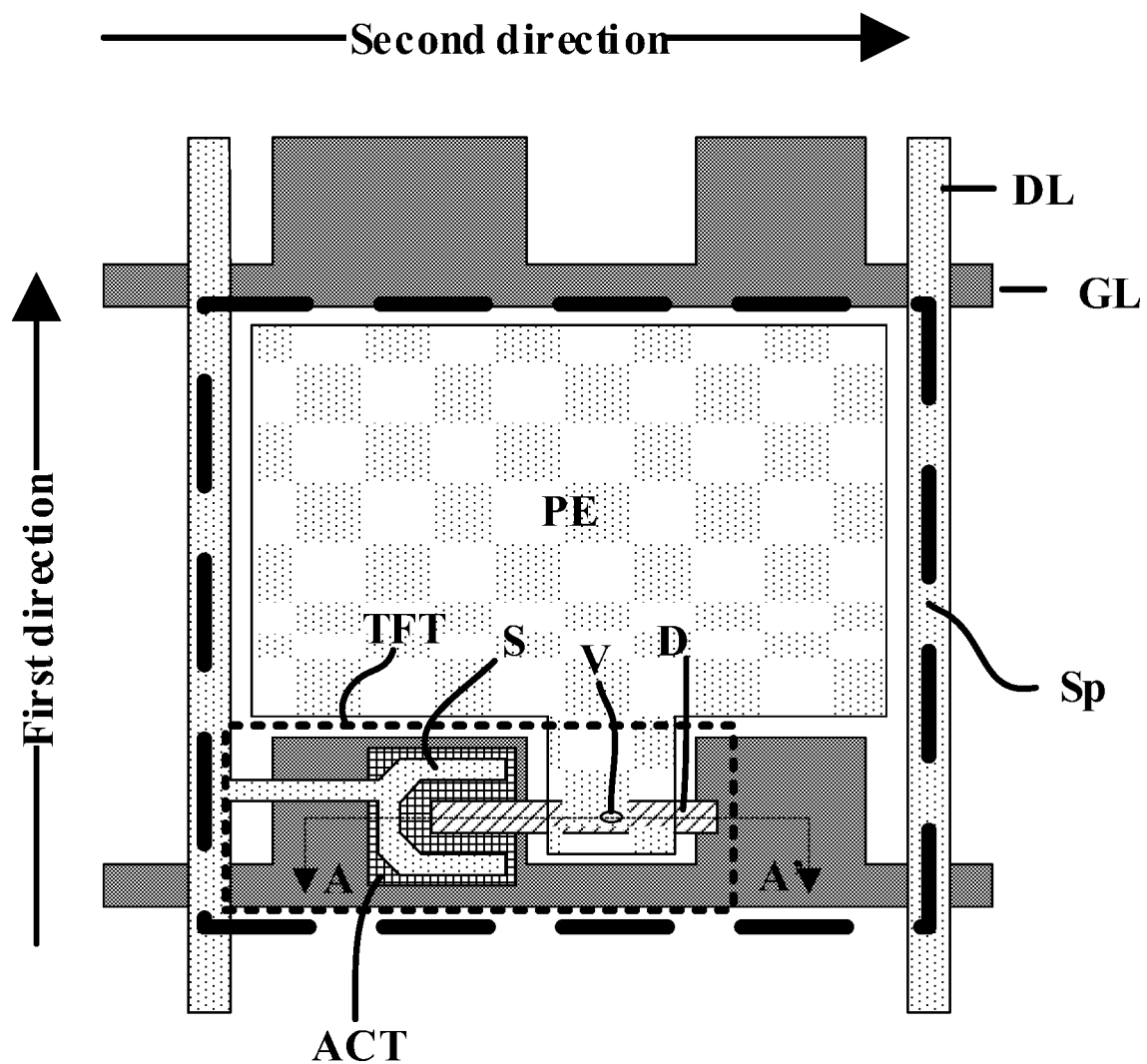
FIG. 1 is a plan view of a respective one of a plurality of subpixels of an array substrate in some embodiments according to the present disclosure.
Figure 2:
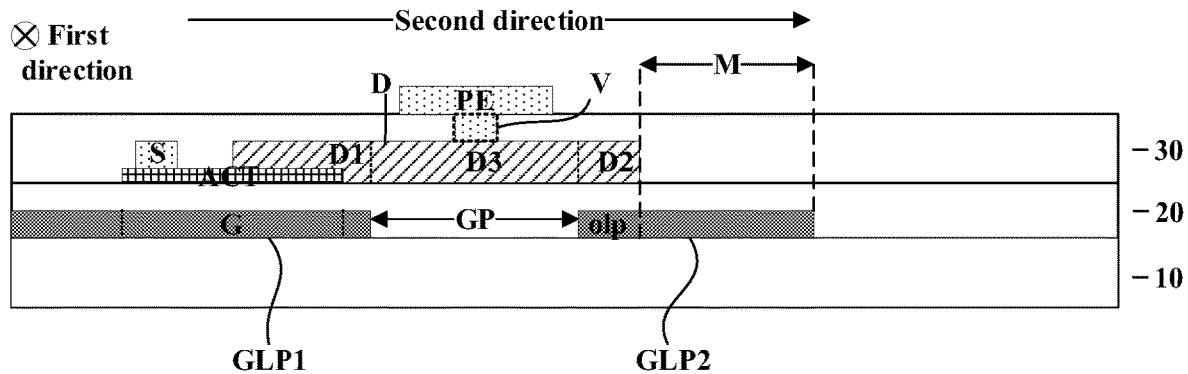
FIG. 2 is a cross-sectional view along an A-A' line in FIG. 1.
Figure 3:
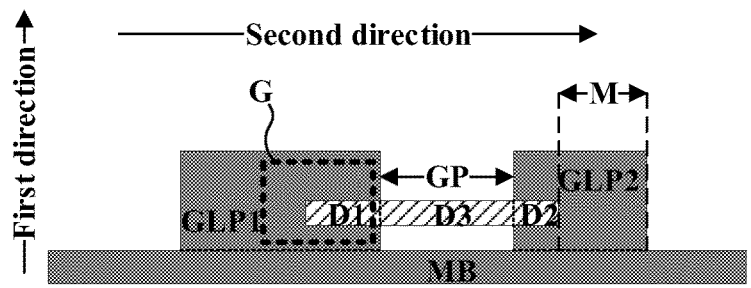
FIG. 3 is a zoom-in plan view of a drain electrode and a respective one of the plurality of gate lines in an array substrate of FIG. 1.

FIG. 1 is a plan view of a respective one of a plurality of subpixels of an array substrate in some embodiments according to the present disclosure. FIG. 2 is a cross-sectional view along an A-A' line in FIG. 1. FIG. 3 is a zoom-in plan view of a drain electrode and a respective one of the plurality of gate lines in an array substrate of FIG. 1. Referring to FIGS. 1 to 3, the array substrate includes a plurality of gate lines GL and a plurality of data lines DL crossing over each other, defining a plurality of subpixels Sp (in a box encircled by the sparsely dashed line). The plurality of gate lines GL are arranged along a first direction, and the plurality of data lines DL are arranged along a second direction. Optionally, each of the plurality of gate lines GL extends along the second direction, and each of the plurality of data lines DL extends along the first direction.

In a respective one of the plurality of subpixels Sp, the array substrate includes a base substrate 10 and a thin film transistor TFT (in a box encircled by the densely dashed line) on the base substrate 10. The thin film transistor includes an active layer ACT, a gate electrode G, a source electrode S, a drain electrode D, and a gate insulating layer 20 between the active layer ACT and the gate electrode G. The source electrode S is electrically connected to a source electrode contact portion of the active layer ACT, the drain electrode D is electrically connected to a drain electrode contact portion of the active layer ACT. Optionally, as shown in FIG. 2, an orthographic projection of the gate electrode G on the base substrate 10 substantially overlaps (e.g., co-extensive) with an orthographic projection of the active layer ACT on the base substrate 10.

Referring to FIG. 3, the respective one of the plurality of gate lines GL includes a main body MB, a first gate line protrusion GLP1, and a second gate line protrusion GLP2. The main body MB, the first gate line protrusion GLP1, and the second gate line protrusion GLP2 are parts of a unitary structure. Referring to FIG. 2 and FIG. 3, in some embodiments, the first gate line protrusion GLP1 and the second gate line protrusion GLP2 are spaced apart by a gap GP, which is filled by the gate insulating layer 20. The first gate line protrusion GLP1 and the second gate line protrusion GLP2 are on a same side of the main body MB, each of the first gate line protrusion GLP1 and the second gate line protrusion GLP2 protrudes from the main body MB along a direction away from the main body MB. Optionally, as shown in FIG. 2 and FIG. 3, the gate electrode G is an integral portion of the first gate line protrusion GLP1. For example, an integral portion of the first gate line protrusion GLP1 corresponding to the active layer ACT is considered as the gate electrode G, an orthographic projection of the gate electrode G on the base substrate 10 substantially overlaps (e.g., co-extensive) with an orthographic projection of the active layer ACT on the base substrate 10.

Referring to FIG. 2 and FIG. 3, in some embodiments, the drain electrode D includes a first portion D1, a second portion D2, and a third portion D3 connecting the first portion D1 and the second portion D2. Optionally, an orthographic projection of the first portion D1 on the base substrate 10 at least partially overlaps with an orthographic projection of a first gate line protrusion GLP1 of a respective one of the plurality of gate lines GL on the base substrate 10. In one example, an entirety of the orthographic projection of the first portion D1 on the base substrate 10 is covered by the orthographic projection of the first gate line protrusion GLP1 of a respective one of the plurality of gate lines GL on the base substrate 10. Optionally, an orthographic projection of the second portion D2 on the base substrate 10 at least partially overlaps with an orthographic projection of a second gate line protrusion GLP2 of the respective one of the plurality of gate lines GL on the base substrate 10. In one example, an entirety of the orthographic projection of the second portion D2 on the base substrate 10 is covered by the orthographic projection of the second gate line protrusion GLP2 of the respective one of the plurality of gate lines GL on the base substrate 10. Optionally, an orthographic projection of the third portion D3 on the base substrate 10 is non-overlapping with an orthographic projection of the plurality of gate lines GL on the base substrate 10. In one example, the orthographic projection of the third portion D3 on the base substrate 10 is non-overlapping with the orthographic projection of the first gate line protrusion GLP1 of the respective one of the plurality of gate lines GL on the base substrate 10, and is non-overlapping with the orthographic projection of the second gate line protrusion GLP2 of the respective one of the plurality of gate lines GL on the base substrate 10. In another example, the third portion D3 corresponds to the gap GP spacing apart the first gate line protrusion GLP1 and the second gate line protrusion GLP2.

Referring to FIG. 2 and FIG. 3, in some embodiments, the second gate line protrusion GLP2 has a margin M along a direction from the first gate line protrusion GLP1 to the second gate line protrusion GLP2. The margin M abuts an overlapping portion olp of the second gate line protrusion GLP2. The overlapping portion olp of the second gate line protrusion GLP2 is a portion whose orthographic projection on the base substrate 10 completely overlaps with the orthographic projection of the second portion D2 on the base substrate 10, as depicted in FIG. 2 and FIG. 3. The overlapping portion olp of the second gate line protrusion GLP2 and the margin M are arranged along the direction from the first gate line protrusion GLP1 to the second gate line protrusion GLP2, e.g., along the second direction.

Referring to FIG. 1 and FIG. 2, in some embodiments, in the respective one of the plurality of subpixels Sp, the array substrate further includes a passivation layer 30 on a side of the source electrode S and the drain electrode D away from the base substrate 10, and a pixel electrode PE on a side of the passivation layer 30 away from the base substrate 10. Optionally, the pixel electrode PE extends through the passivation layer 30 to electrically connected to the third portion D3 of the drain electrode D. The array substrate has a via V extending through the passivation layer 30, the pixel electrode PE is connected to the third portion D3 of the drain electrode D through the via V extending through the passivation layer 30.

In some embodiments, and as shown in FIG. 1-3, the plurality of gate lines GL are arranged along a first direction, the plurality of data lines DL are arranged along a second direction, and the direction from the first gate line protrusion GLP1 to the second gate line protrusion GLP2 is substantially parallel to the second direction. Optionally, the first portion D1, the second portion D2, and the third portion D3 are arranged along a direction substantially parallel to the second direction. As used herein, the term "substantially parallel" refers to two directions having an included angle between them in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, approximately 10 degree to approximately 15 degrees, or approximately 0 degree.

In some embodiments, an orthographic projection of the first gate line protrusion GLP1 on the base substrate 10 at least partially overlaps with an orthographic projection of the active layer ACT on the base substrate 10; and an orthographic projection of the second gate line protrusion GLP2 on the base substrate 10 is non-overlapping with the orthographic projection of the active layer ACT on the base substrate 10. Optionally, as discussed above, the first gate line protrusion GLP1 includes the gate electrode G as an integral part, an orthographic projection of the gate electrode G on the base substrate 10 at least partially overlaps (e.g., substantially overlaps) with the orthographic projection of the active layer ACT on the base substrate 10.

Figure 4A:
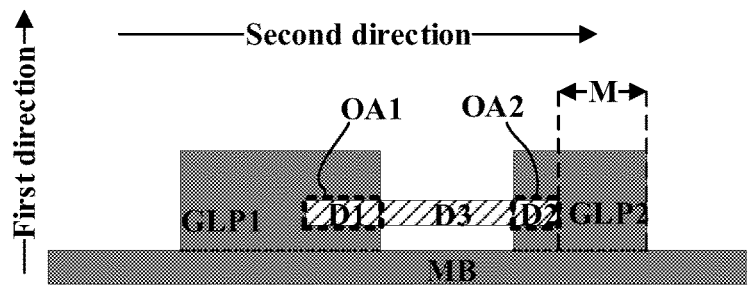
FIG. 4A and FIG. 4B illustrate that a parasitic capacitance formed between a drain electrode and a respective one of the plurality of gate lines remains substantially the same regardless relative positional shift between the drain electrode and the respective one of the plurality of gate lines.
Figure 4B:
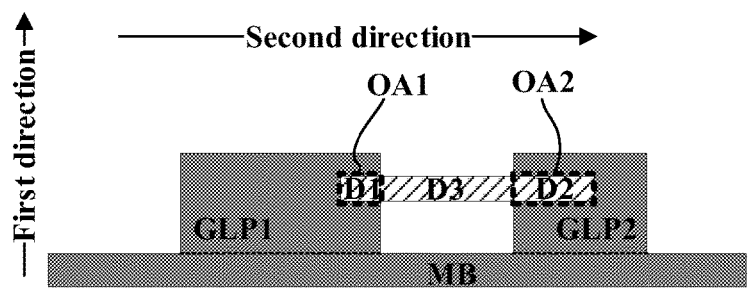

In the present array substrate, the drain electrode D, the gate insulating layer 20, and the respective one of the plurality of gate lines GL (including the gate electrode G) form a parasitic capacitance. In some embodiments, the parasitic capacitance remains substantially the same regardless relative positional shift between the drain electrode D and the respective one of the plurality of gate lines GL, e.g., due to the alignment error of a mask plate used in fabricating the drain electrode D. FIG. 4A and FIG. 4B illustrate that a parasitic capacitance formed between a drain electrode and a respective one of the plurality of gate lines remains substantially the same regardless relative positional shift between the drain electrode and the respective one of the plurality of gate lines. Referring to FIG. 4A, a first array substrate is fabricated, the drain electrode D is at a first position relative to the first gate line protrusion GLP1 and the second gate line protrusion GLP2. Referring to FIG. 4B, a second array substrate is fabricated, the drain electrode D is at a second position relative to the first gate line protrusion GLP1 and the second gate line protrusion GLP2. As shown in FIG. 4A and FIG. 4B, the second position is shifted relative to the first position, this may due to an alignment error of a mask plate for fabricating the drain electrode D and/or a mask plate for fabricating the first gate line protrusion GLP1 and the second gate line protrusion GLP2. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Referring to FIG. 4A, an orthographic projection of the first portion D1 of the drain electrode D on the base substrate overlaps with an orthographic projection of a first gate line protrusion GLP1 of a respective one of the plurality of gate lines on the base substrate, resulting in a first overlapping area OA1; an orthographic projection of the second portion D2 of the drain electrode D on the base substrate overlaps with an orthographic projection of a second gate line protrusion GLP2 of the respective one of the plurality of gate lines on the base substrate, resulting in a second overlapping area OA2. Referring to FIG. 4B, due to the relative positional shift between the drain electrode D and the first gate line protrusion GLP1 and between the drain electrode D and the second gate line protrusion GLP2, the first overlapping area OA1 decreases, and the second overlapping area OA2 increases. However, a total overlapping area including the first overlapping area OA1 and the second overlapping area OA2 remains substantially the same between the first array substrate in FIG. 4A and the second array substrate in FIG. 4B. As a result, the parasitic capacitance between the drain electrode D and a respective one of the plurality of gate lines remains substantially the same. The present array substrate and fabricating method thereof can ensure that the parasitic capacitance remains substantially unchanged, obviating adverse effects of changes of the parasitic capacitance on the characteristics of the thin film transistor (e.g., threshold voltage).

Figure 5:
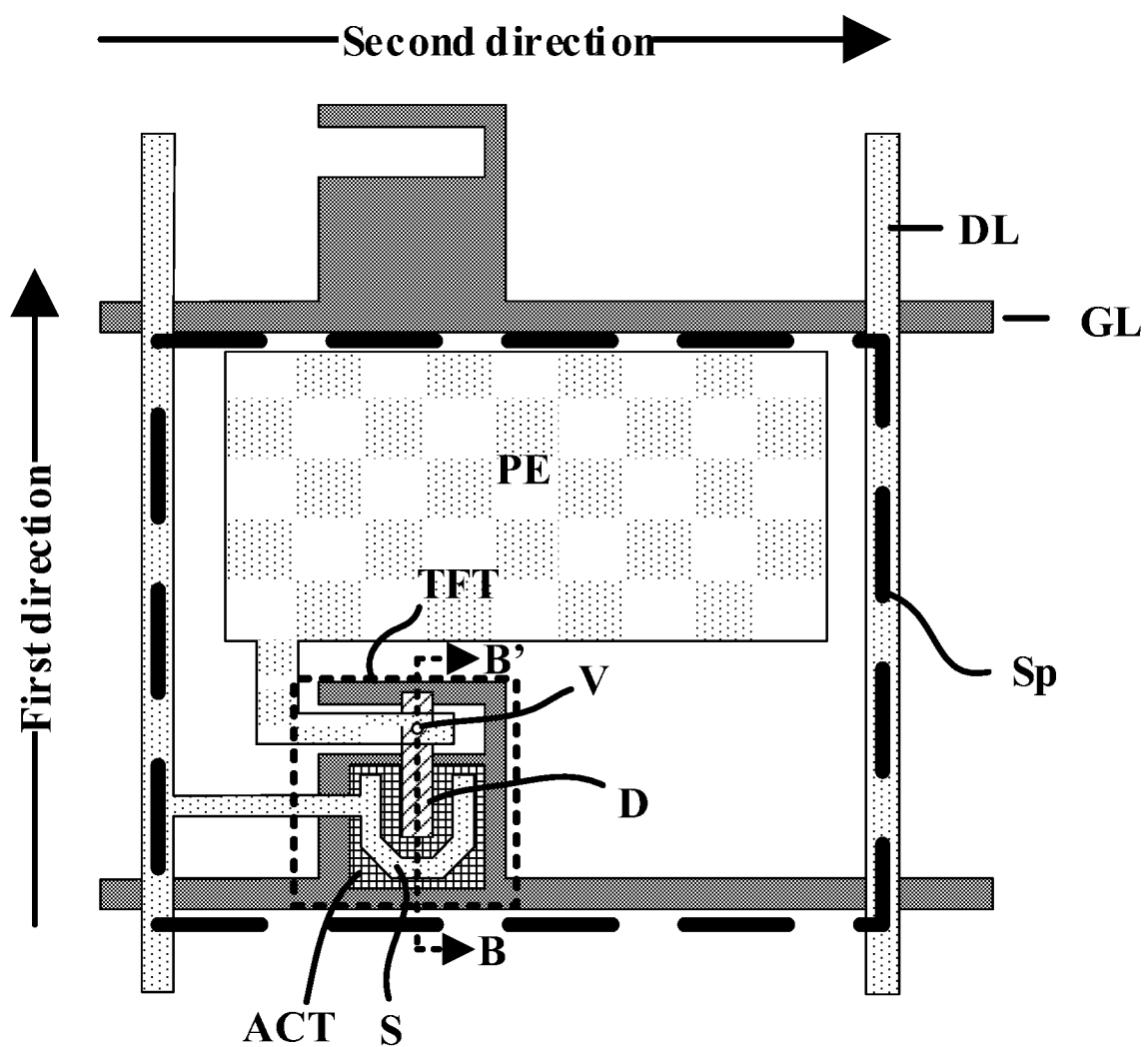
FIG. 5 is a plan view of a respective one of a plurality of subpixels of an array substrate in some embodiments according to the present disclosure.
Figure 6:
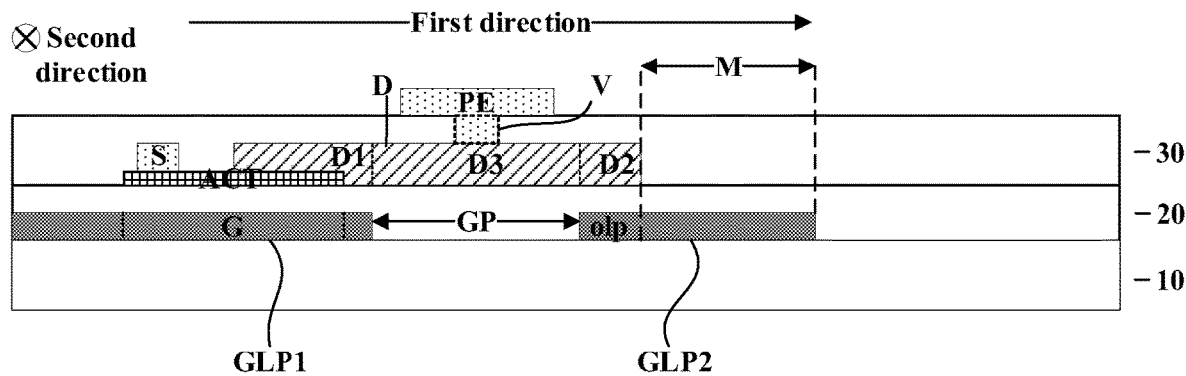
FIG. 6 is a cross-sectional view along a B-B' line in FIG. 5.
Figure 7:
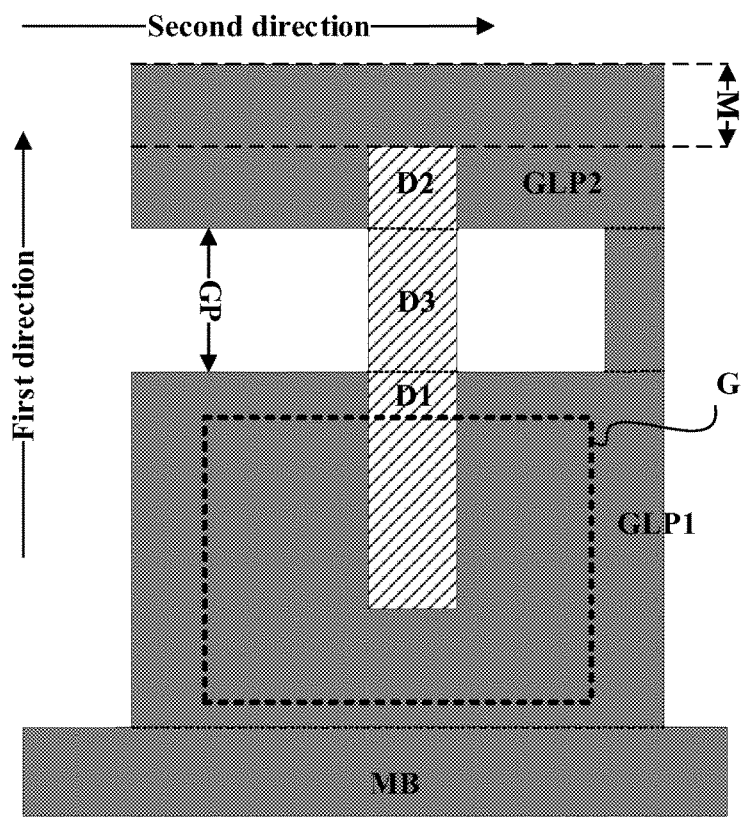
FIG. 7 is a zoom-in plan view of a drain electrode and a respective one of the plurality of gate lines in an array substrate of FIG. 5.

FIG. 5 is a plan view of a respective one of a plurality of subpixels of an array substrate in some embodiments according to the present disclosure. FIG. 6 is a cross-sectional view along a B-B' line in FIG. 5. FIG. 7 is a zoom-in plan view of a drain electrode and a respective one of the plurality of gate lines in an array substrate of FIG. 5. Referring to FIGS. 5 to 7, the array substrate includes a plurality of gate lines GL and a plurality of data lines DL crossing over each other, defining a plurality of subpixels Sp (in a box encircled by the sparsely dashed line). The plurality of gate lines GL are arranged along a first direction, and the plurality of data lines DL are arranged along a second direction. Optionally, each of the plurality of gate lines GL extends along the second direction, and each of the plurality of data lines DL extends along the first direction. The array substrate of FIGS. 5 to 7 differs from the array substrate of FIGS. 1 to 3 at least in that, in the array substrate of FIGS. 5 to 7, the direction from the first gate line protrusion GLP1 to the second gate line protrusion GLP2 is substantially parallel to the first direction (e.g., parallel to the plurality of data lines DL); whereas, in the array substrate of FIGS. 1 to 3, the direction from the first gate line protrusion GLP1 to the second gate line protrusion GLP2 is substantially parallel to the second direction (e.g., parallel to the plurality of gate lines GL). Optionally, the first portion D1, the second portion D2, and the third portion D3 are arranged along a direction substantially parallel to the first direction.

Referring to FIG. 6, a respective one of the plurality of gate line GL includes a main body MB, a first gate line protrusion GLP1, and a second gate line protrusion GLP2. The main body MB, the first gate line protrusion GLP1, and the second gate line protrusion GLP2 are parts of a unitary structure. Referring to FIG. 6 and FIG. 7, in some embodiments, the first gate line protrusion GLP1 and the second gate line protrusion GLP2 are spaced apart by a gap GP, which is filled by the gate insulating layer 20. The first gate line protrusion GLP1 and the second gate line protrusion GLP2 are on a same side of the main body MB, the first gate line protrusion GLP1 protrudes from the main body MB along a direction away from the main body MB, and the second gate line protrusion GLP2 is on a side of the first gate line protrusion GLP1 away from the main body MB. Optionally, as shown in FIG. 6 and FIG. 7, the gate electrode G is an integral portion of the first gate line protrusion GLP1. For example, an integral portion of the first gate line protrusion GLP1 corresponding to the active layer ACT is considered as the gate electrode G, an orthographic projection of the gate electrode G on the base substrate 10 substantially overlaps (e.g., co-extensive) with an orthographic projection of the active layer ACT on the base substrate 10.

Referring to FIG. 6 and FIG. 7, in some embodiments, an orthographic projection of the first portion D1 on the base substrate 10 at least partially overlaps with an orthographic projection of a first gate line protrusion GLP1 of a respective one of the plurality of gate lines GL on the base substrate 10, and an orthographic projection of the second portion D2 on the base substrate 10 at least partially overlaps with an orthographic projection of a second gate line protrusion GLP2 of the respective one of the plurality of gate lines GL on the base substrate 10. Optionally, an entirety of the orthographic projection of the first portion D1 on the base substrate 10 is covered by the orthographic projection of the first gate line protrusion GLP1 of a respective one of the plurality of gate lines GL on the base substrate 10, and an entirety of the orthographic projection of the second portion D2 on the base substrate 10 is covered by the orthographic projection of the second gate line protrusion GLP2 of the respective one of the plurality of gate lines GL on the base substrate 10. Optionally, an orthographic projection of the third portion D3 on the base substrate 10 is non-overlapping with an orthographic projection of the plurality of gate lines GL (including the first gate line protrusion GLP1 and the second gate line protrusion GLP2) on the base substrate 10. In another example, the third portion D3 corresponds to the gap GP spacing apart the first gate line protrusion GLP1 and the second gate line protrusion GLP2. The first gate line protrusion GLP1 and the second gate line protrusion GLP2 are connected to each other on one side of the gap GP.

Referring to FIG. 6 and FIG. 7, in some embodiments, the second gate line protrusion GLP2 has a margin M along a direction from the first gate line protrusion GLP1 to the second gate line protrusion GLP2. The margin M abuts an overlapping portion olp of the second gate line protrusion GLP2. The overlapping portion olp of the second gate line protrusion GLP2 is a portion whose orthographic projection on the base substrate 10 completely overlaps with the orthographic projection of the second portion D2 on the base substrate 10. The overlapping portion olp of the second gate line protrusion GLP2 and the margin M are arranged along the direction from the first gate line protrusion GLP1 to the second gate line protrusion GLP2, e.g., along the first direction.

In some embodiments, an orthographic projection of the first gate line protrusion GLP1 on the base substrate 10 at least partially overlaps with an orthographic projection of the active layer ACT on the base substrate 10; and an orthographic projection of the second gate line protrusion GLP2 on the base substrate 10 is non-overlapping with the orthographic projection of the active layer ACT on the base substrate 10. Optionally, the first gate line protrusion GLP1 includes the gate electrode G as an integral part, an orthographic projection of the gate electrode G on the base substrate 10 at least partially overlaps (e.g., substantially overlaps) with the orthographic projection of the active layer ACT on the base substrate 10.

Referring to FIG. 5 and FIG. 6, in some embodiments, the pixel electrode PE extends through the passivation layer 30 to electrically connected to the third portion D3 of the drain electrode D. The array substrate has a via V extending through the passivation layer 30, the pixel electrode PE is connected to the third portion D3 of the drain electrode D through the via V extending through the passivation layer 30.

Figure 8B:
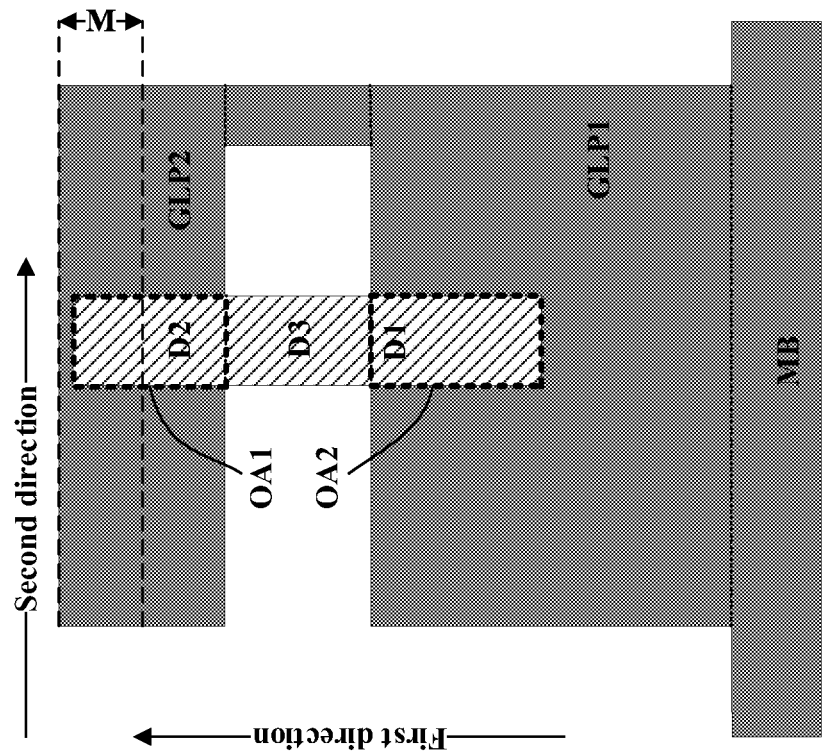
FIG. 8A and FIG. 8B illustrate that a parasitic capacitance formed between a drain electrode and a respective one of the plurality of gate lines remains substantially the same regardless relative positional shift between the drain electrode and the respective one of the plurality of gate lines.
Figure 8A:
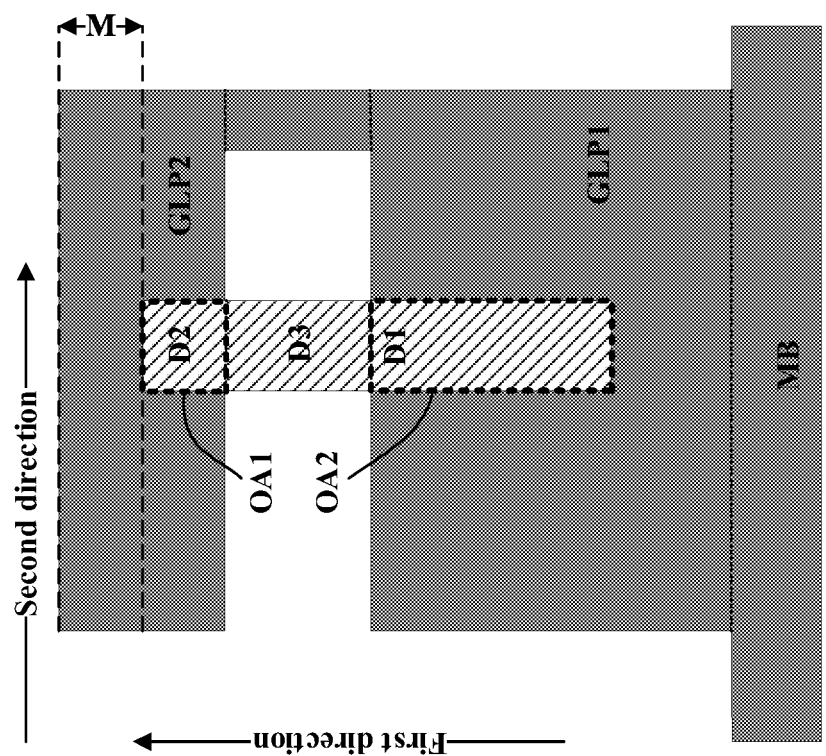

FIG. 8A and FIG. 8B illustrate that a parasitic capacitance formed between a drain electrode and a respective one of the plurality of gate lines remains substantially the same regardless relative positional shift between the drain electrode and the respective one of the plurality of gate lines. Referring to FIG. 8A, a first array substrate is fabricated, the drain electrode D is at a first position relative to the first gate line protrusion GLP1 and the second gate line protrusion GLP2; an orthographic projection of the first portion D1 of the drain electrode D on the base substrate overlaps with an orthographic projection of a first gate line protrusion GLP1 of a respective one of the plurality of gate lines on the base substrate, resulting in a first overlapping area OA1; an orthographic projection of the second portion D2 of the drain electrode D on the base substrate overlaps with an orthographic projection of a second gate line protrusion GLP2 of the respective one of the plurality of gate lines on the base substrate, resulting in a second overlapping area OA2. Referring to FIG. 8B, a second array substrate is fabricated, the drain electrode D is at a second position relative to the first gate line protrusion GLP1 and the second gate line protrusion GLP2. As shown in FIG. 8A and FIG. 8B, the second position is shifted relative to the first position. Referring to FIG. 8A and FIG. 8B, due to the relative positional shift between the drain electrode D and the first gate line protrusion GLP1 and between the drain electrode D and the second gate line protrusion GLP2, the first overlapping area OA1 decreases, and the second overlapping area OA2 increases. However, a total overlapping area including the first overlapping area OA1 and the second overlapping area OA2 remains substantially the same between the first array substrate and the second array substrate. As a result, the parasitic capacitance between the drain electrode D and a respective one of the plurality of gate lines remains substantially the same.

Figure 9:
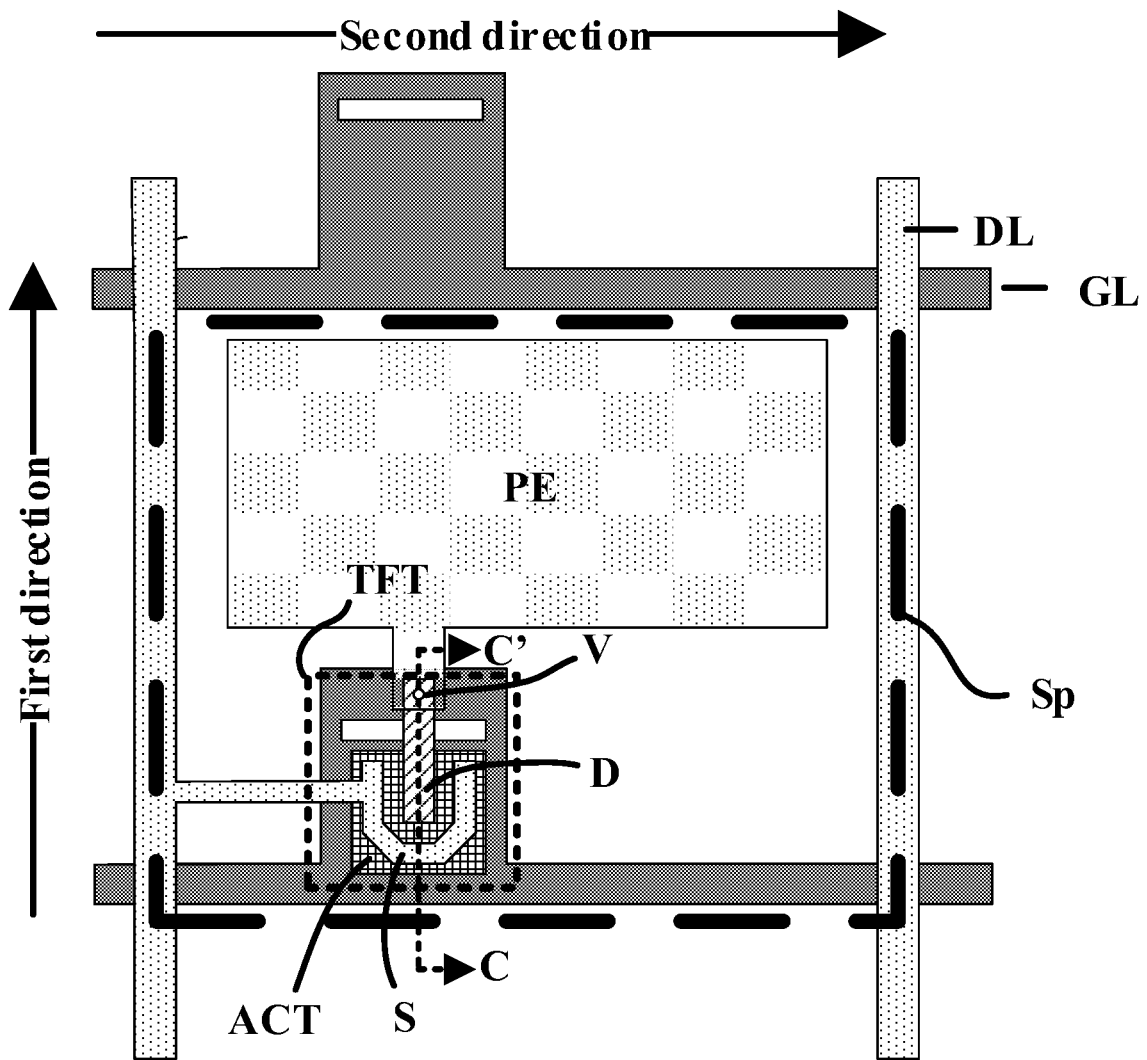
FIG. 9 is a plan view of a respective one of a plurality of subpixels of an array substrate in some embodiments according to the present disclosure.
Figure 10:
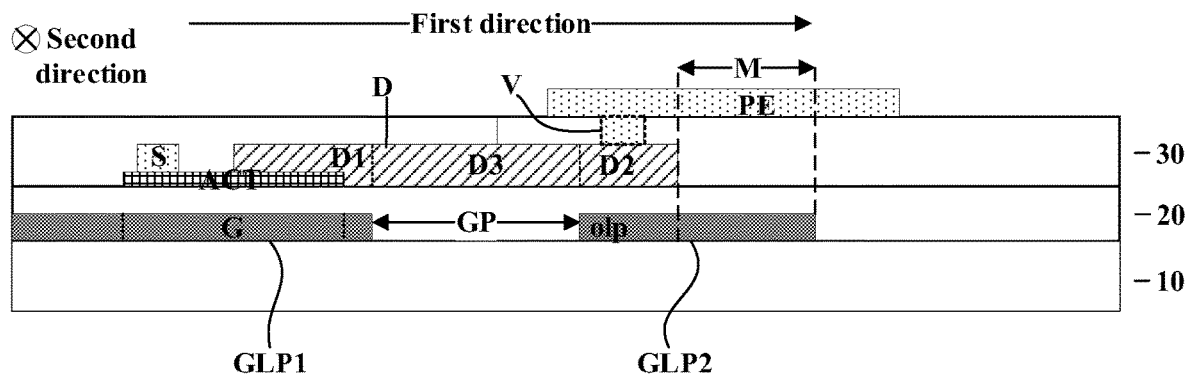
FIG. 10 is a cross-sectional view along a C-C' line in FIG. 9.
Figure 11:
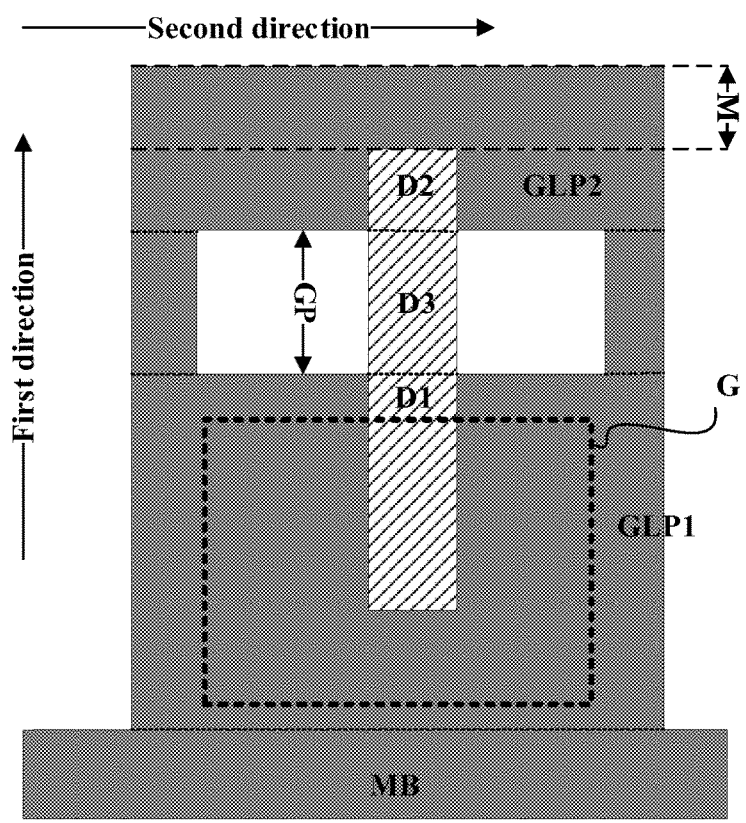
FIG. 11 is a zoom-in plan view of a drain electrode and a respective one of the plurality of gate lines in an array substrate of FIG. 9.
Figure 12B:
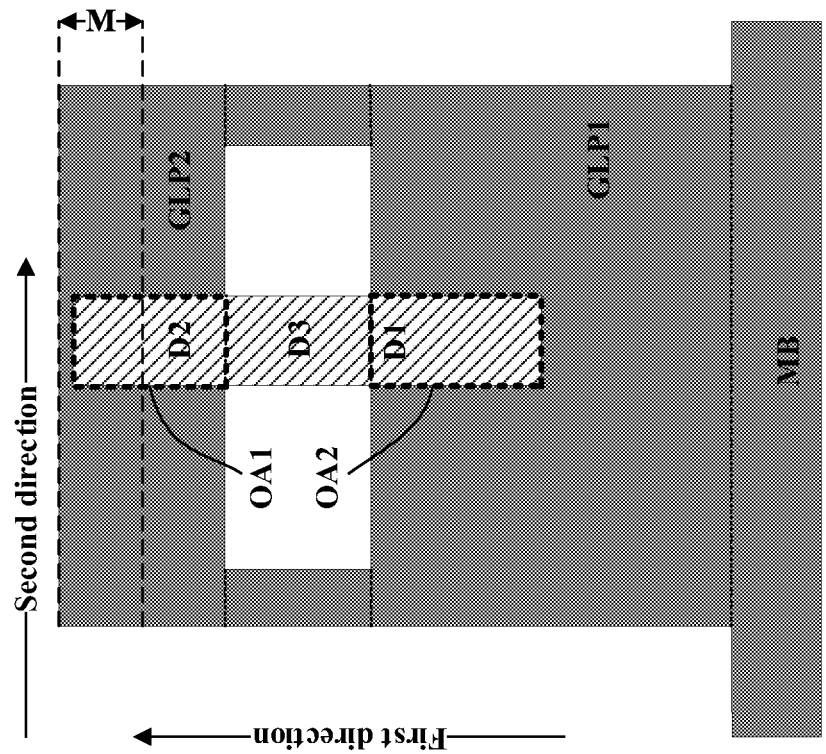
FIG. 12A and FIG. 12B illustrate that a parasitic capacitance formed between a drain electrode and a respective one of the plurality of gate lines remains substantially the same regardless relative positional shift between the drain electrode and the respective one of the plurality of gate lines.
Figure 12A:
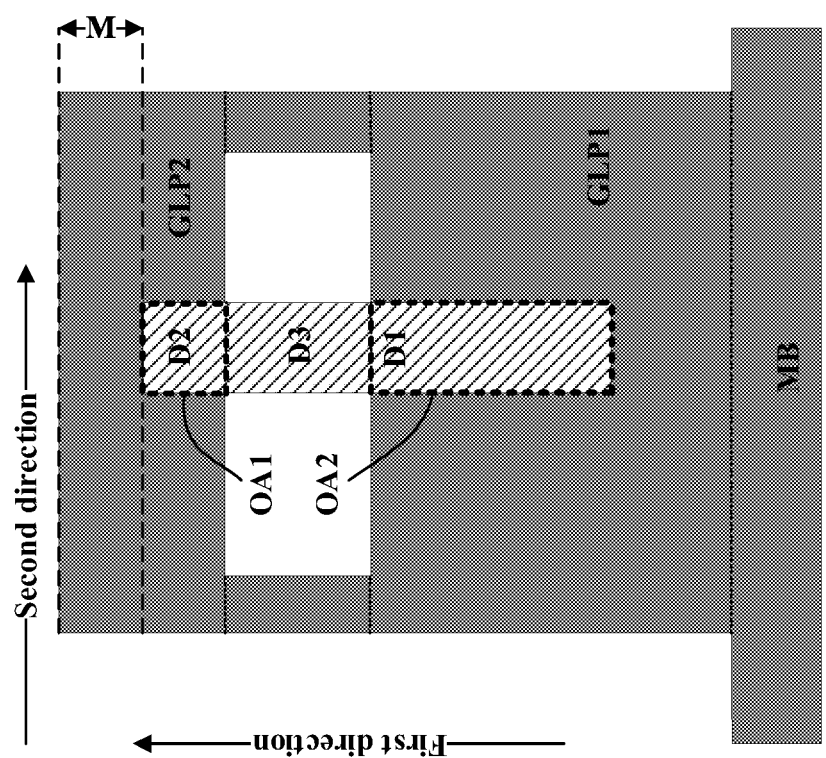

FIG. 9 is a plan view of a respective one of a plurality of subpixels of an array substrate in some embodiments according to the present disclosure. FIG. 10 is a cross-sectional view along a C-C' line in FIG. 9. FIG. 11 is a zoom-in plan view of a drain electrode and a respective one of the plurality of gate lines in an array substrate of FIG. 9. FIG. 12A and FIG. 12B illustrate that a parasitic capacitance formed between a drain electrode and a respective one of the plurality of gate lines remains substantially the same regardless relative positional shift between the drain electrode and the respective one of the plurality of gate lines. The array substrate in FIGS. 9 to 11 differs from that in FIGS. 5 to 7 at least in that the gap GP spacing apart the first gate line protrusion GLP1 and the second gate line protrusion GLP2 is a closed gap in FIGS. 9 to 11, whereas the gap GP spacing apart the first gate line protrusion GLP1 and the second gate line protrusion GLP2 is an open gap in FIGS. 5 to 7. The first gate line protrusion GLP1 and the second gate line protrusion GLP2 are connected to each other on both sides of the gap GP.

Referring to FIG. 9 and FIG. 10, the pixel electrode PE extends through the passivation layer 30 to electrically connected to the second portion D2 of the drain electrode D. The array substrate has a via V extending through the passivation layer 30, the pixel electrode PE is connected to the second portion D2 of the drain electrode D through the via V extending through the passivation layer 30.

Figure 13:
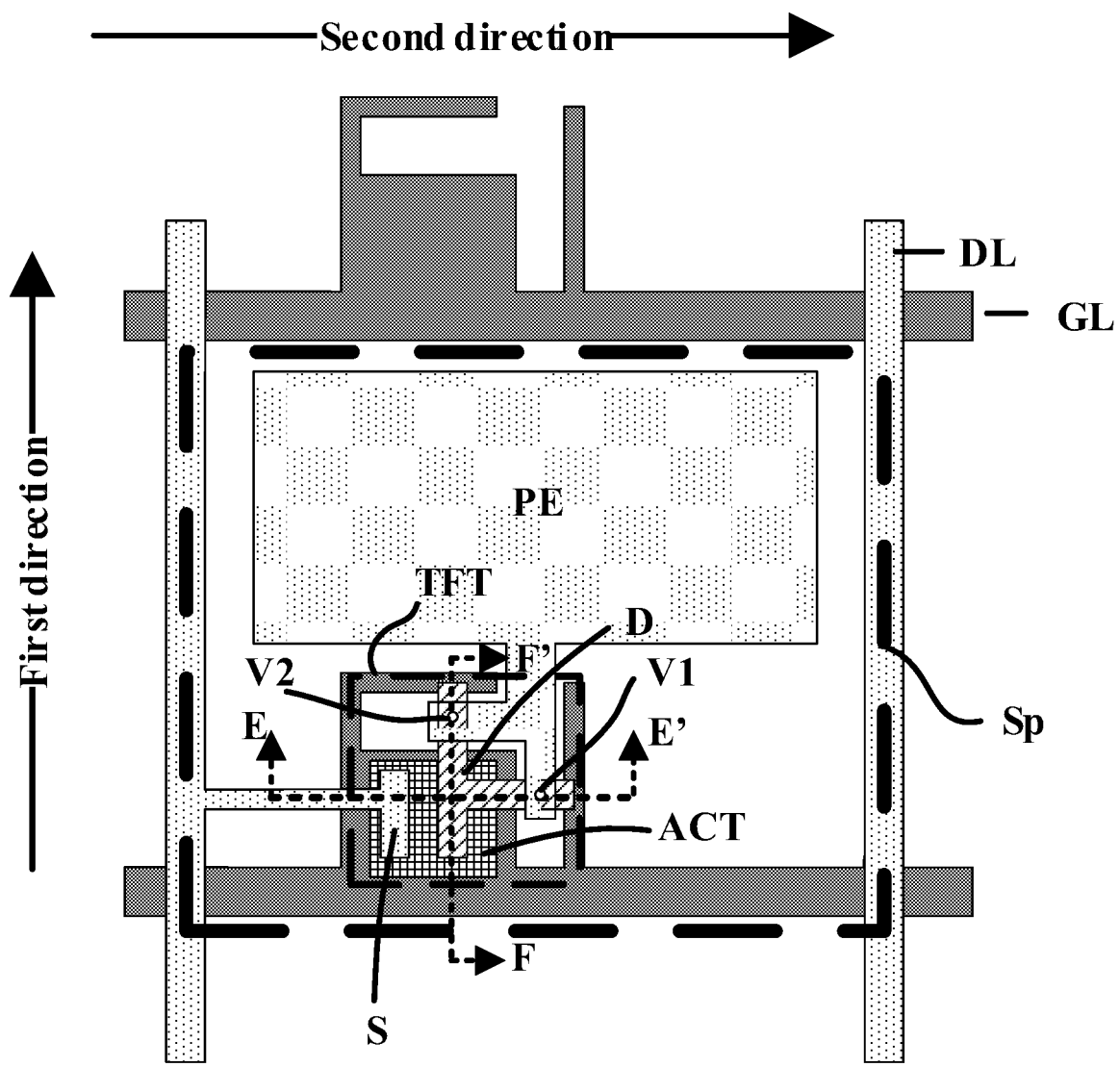
FIG. 13 is a plan view of a respective one of a plurality of subpixels of an array substrate in some embodiments according to the present disclosure.
Figure 14:
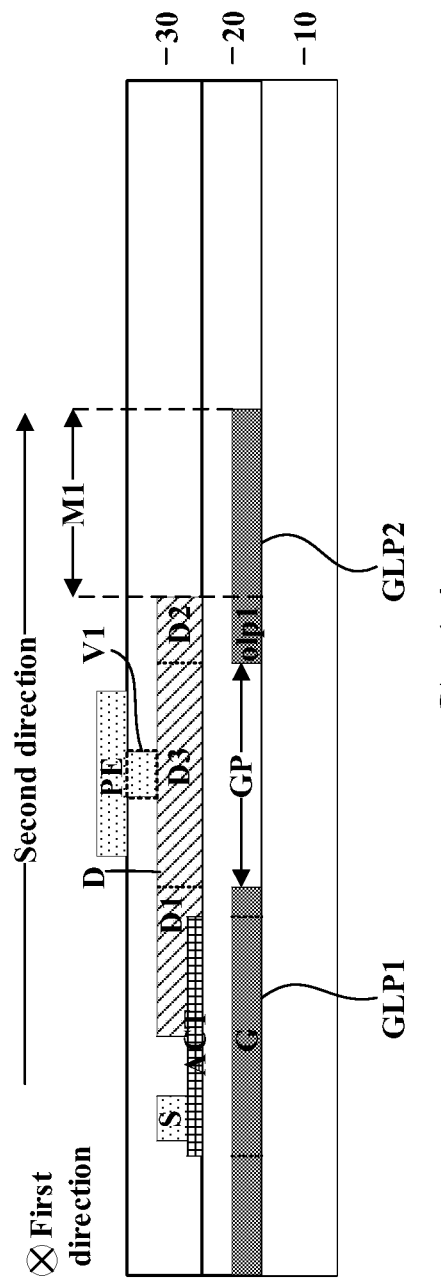
FIG. 14 is a cross-sectional view along an E-E' line in FIG. 13.
Figure 15:
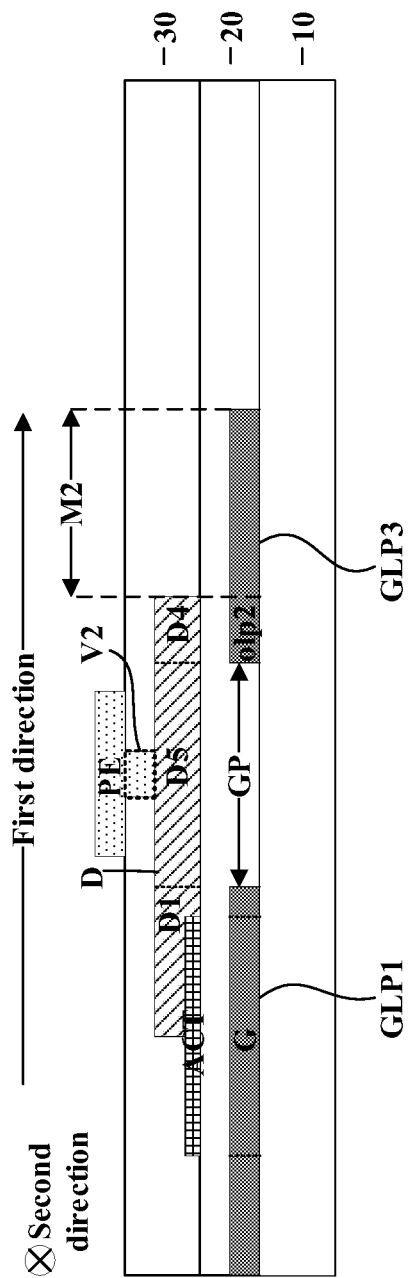
FIG. 15 is a cross-sectional view along a F-F' line in FIG. 13.
Figure 16:
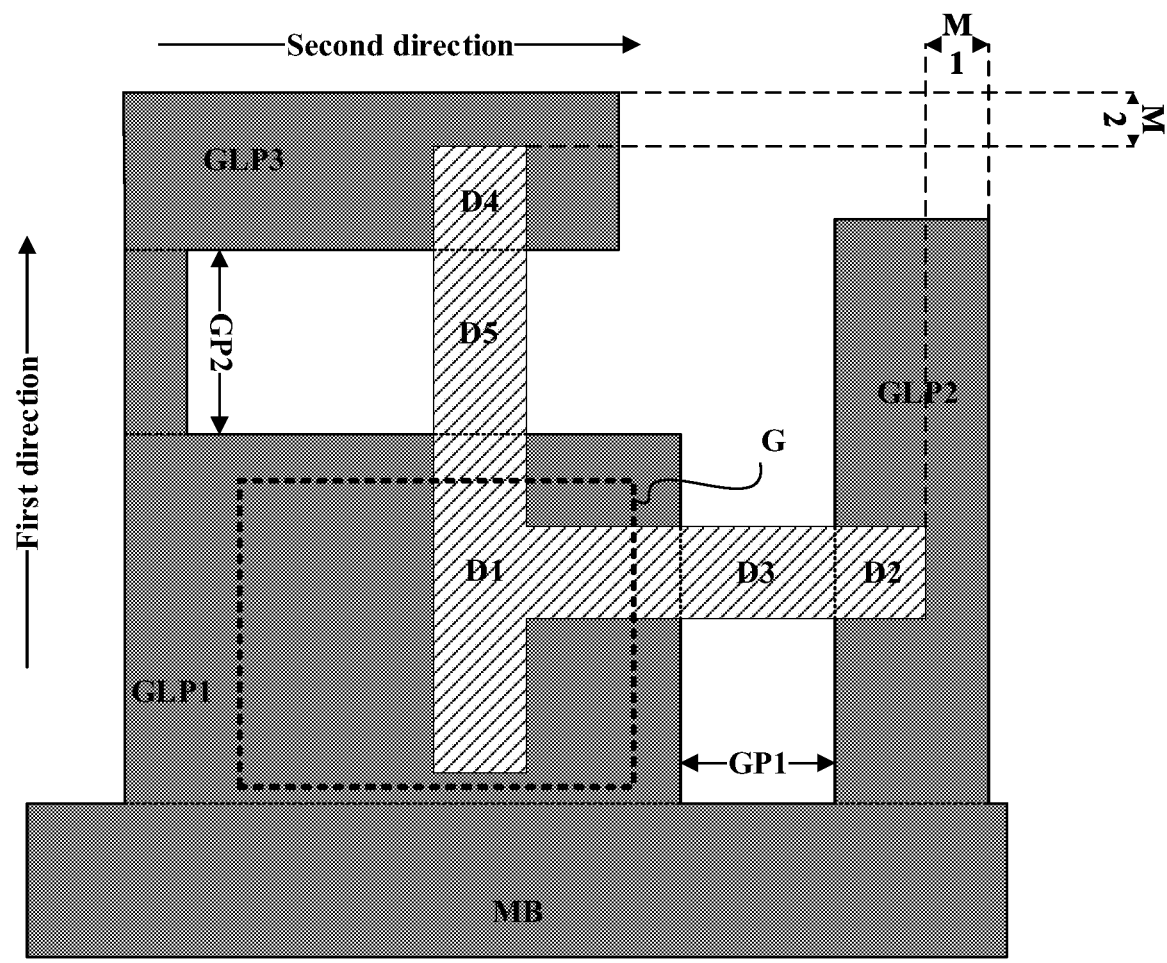
FIG. 16 is a zoom-in plan view of a drain electrode and a respective one of the plurality of gate lines in an array substrate of FIG. 13.

In some embodiments, the drain electrode includes a first portion, a second portion, a third portion, a fourth portion and a fifth portion. The respective one of the plurality of gate lines includes a first gate line protrusion, a second gate line protrusion, and a third gate line protrusion. FIG. 13 is a plan view of a respective one of a plurality of subpixels of an array substrate in some embodiments according to the present disclosure. FIG. 14 is a cross-sectional view along an E-E' line in FIG. 13. FIG. 15 is a cross-sectional view along a F-F' line in FIG. 13. FIG. 16 is a zoom-in plan view of a drain electrode and a respective one of the plurality of gate lines in an array substrate of FIG. 13. Referring to FIGS. 13 to 16, in some embodiments, the drain electrode D includes a first portion D1, a second portion D2, a third portion D3, a fourth portion D4, and a fifth portion D5. The respective one of the plurality of gate lines GL includes a main body MB, a first gate line protrusion GLP1, a second gate line protrusion GLP2, and a third gate line protrusion GLP3. The main body MB, the first gate line protrusion GLP1, the second gate line protrusion GLP2, and the third gate line protrusion GLP3 are parts of a unitary structure.

Referring to FIG. 14 and FIG. 16, in some embodiments, the first gate line protrusion GLP1 and the second gate line protrusion GLP2 are spaced apart by a first gap GP1, the first gate line protrusion GLP1 and the third gate line protrusion GLP3 are spaced apart by a second gap GP2. The first gap GP1 and the second gap GP2 are filled by the gate insulating layer 20. The first gate line protrusion GLP1 and the second gate line protrusion GLP2 are on a same side of the main body MB, each of the first gate line protrusion GLP1 and the second gate line protrusion GLP2 protrudes from the main body MB along a direction away from the main body MB. The first gate line protrusion GLP1 and the third gate line protrusion GLP3 are on a same side of the main body MB, the first gate line protrusion GLP1 protrudes from the main body MB along a direction away from the main body MB, and the third gate line protrusion GLP3 is on a side of the first gate line protrusion GLP1 away from the main body MB. Optionally, as shown in FIGS. 14 to 16, the gate electrode G is an integral portion of the first gate line protrusion GLP1. For example, an integral portion of the first gate line protrusion GLP1 corresponding to the active layer ACT is considered as the gate electrode G, an orthographic projection of the gate electrode G on the base substrate 10 substantially overlaps (e.g., co-extensive) with an orthographic projection of the active layer ACT on the base substrate 10.

Referring to FIGS. 14 to 16, in some embodiments, the drain electrode D includes a first portion D1, a second portion D2, a third portion D3 connecting the first portion D1 and the second portion D2, a fourth portion D4, and a fifth portion D5 connecting the first portion D1 and the fourth portion D4. In some embodiments, an orthographic projection of the first portion D1 on the base substrate 10 at least partially overlaps with an orthographic projection of a first gate line protrusion GLP1 of a respective one of the plurality of gate lines GL on the base substrate 10; an orthographic projection of the second portion D2 on the base substrate 10 at least partially overlaps with an orthographic projection of a second gate line protrusion GLP2 of the respective one of the plurality of gate lines GL on the base substrate 10; and an orthographic projection of the fourth portion D4 on the base substrate 10 at least partially overlaps with an orthographic projection of a third gate line protrusion GLP3 of the respective one of the plurality of gate lines GL on the base substrate 10. Optionally, an entirety of the orthographic projection of the first portion D1 on the base substrate 10 is covered by the orthographic projection of the first gate line protrusion GLP1 of a respective one of the plurality of gate lines GL on the base substrate 10; an entirety of the orthographic projection of the second portion D2 on the base substrate 10 is covered by the orthographic projection of the second gate line protrusion GLP2 of the respective one of the plurality of gate lines GL on the base substrate 10; and an entirety of the orthographic projection of the third portion D3 on the base substrate 10 is covered by the orthographic projection of the third gate line protrusion GLP3 of the respective one of the plurality of gate lines GL on the base substrate 10.

Optionally, an orthographic projection of the third portion D3 on the base substrate 10 is non-overlapping with an orthographic projection of the plurality of gate lines GL (including the first gate line protrusion GLP1, the second gate line protrusion GLP2, and the third gate line protrusion GLP3) on the base substrate 10; and an orthographic projection of the fifth portion D5 on the base substrate 10 is non-overlapping with an orthographic projection of the plurality of gate lines GL (including the first gate line protrusion GLP1, the second gate line protrusion GLP2, and the third gate line protrusion GLP3) on the base substrate 10.

Optionally, the third portion D3 corresponds to the first gap GP1 spacing apart the first gate line protrusion GLP1 and the second gate line protrusion GLP2; and the fifth portion D5 corresponds to the second gap GP2 spacing apart the first gate line protrusion GLP1 and the third gate line protrusion GLP3. The first gate line protrusion GLP1 and the second gate line protrusion GLP2 are connected to each other on one side of the first gap GP1; and the first gate line protrusion GLP1 and the third gate line protrusion GLP3 are connected to each other on one side of the second gap GP2.

Referring to FIGS. 14 to 16, in some embodiments, the second gate line protrusion GLP2 has a first margin M1 along a direction from the first gate line protrusion GLP1 to the second gate line protrusion GLP2; and the third gate line protrusion GLP3 has a second margin M2 along a direction from the first gate line protrusion GLP1 to the third gate line protrusion GLP3. The first margin M1 abuts a first overlapping portion olp1 of the second gate line protrusion GLP2, and the second margin M2 abuts a second overlapping portion olp2 of the third gate line protrusion GLP3. The first overlapping portion olp1 of the second gate line protrusion GLP2 is a portion whose orthographic projection on the base substrate 10 completely overlaps with the orthographic projection of the second portion D2 on the base substrate 10, as depicted in FIG. 14 and FIG. 16. The first overlapping portion olp1 of the second gate line protrusion GLP2 and the first margin M1 are arranged along the direction from the first gate line protrusion GLP1 to the second gate line protrusion GLP2, e.g., along the second direction. The second overlapping portion olp2 of the third gate line protrusion GLP3 is a portion whose orthographic projection on the base substrate 10 completely overlaps with the orthographic projection of the fourth portion D4 on the base substrate 10. The second overlapping portion olp2 of the third gate line protrusion GLP3 and the second margin M2 are arranged along the direction from the first gate line protrusion GLP1 to the third gate line protrusion GLP3, e.g., along the first direction.

Referring to FIG. 13 to FIG. 15, in some embodiments, in the respective one of the plurality of subpixels Sp (in a box encircled by the sparsely dashed line), the array substrate further includes a passivation layer 30 on a side of the source electrode S and the drain electrode D away from the base substrate 10, and a pixel electrode PE on a side of the passivation layer 30 away from the base substrate 10. Optionally, the pixel electrode PE extends through the passivation layer 30 to electrically connected to the third portion D3 of the drain electrode D, and electrically connected to the fifth portion D5 of the drain electrode D. The array substrate has a first via V1 extending through the passivation layer 30, the pixel electrode PE is connected to the third portion D3 of the drain electrode D through the first via V1 extending through the passivation layer 30. The array substrate has a second via V2 extending through the passivation layer 30, the pixel electrode PE is connected to the fifth portion D5 of the drain electrode D through the second via V2 extending through the passivation layer 30.

In some embodiments, an orthographic projection of the first gate line protrusion GLP1 on the base substrate 10 at least partially overlaps with an orthographic projection of the active layer ACT on the base substrate 10; an orthographic projection of the second gate line protrusion GLP2 on the base substrate 10 is non-overlapping with the orthographic projection of the active layer ACT on the base substrate 10; and an orthographic projection of the third gate line protrusion GLP3 on the base substrate 10 is non-overlapping with the orthographic projection of the active layer ACT on the base substrate 10. Optionally, the first gate line protrusion GLP1 includes the gate electrode G as an integral part, an orthographic projection of the gate electrode G on the base substrate 10 at least partially overlaps (e.g., substantially overlaps) with the orthographic projection of the active layer ACT on the base substrate 10.

In some embodiments, and as shown in FIG. 13-16, the plurality of gate lines GL are arranged along a first direction, the plurality of data lines DL are arranged along a second direction. Optionally, the direction from the first gate line protrusion GLP1 to the second gate line protrusion GLP2 is substantially parallel to the second direction; and the direction from the first gate line protrusion GLP1 to the third gate line protrusion GLP2 is substantially parallel to the first direction. Optionally, the first portion D1, the second portion D2, and the third portion D3 are arranged along a direction substantially parallel to the second direction; and the first portion D1, the fourth portion D4, and the fifth portion D5 are arranged along a direction substantially parallel to the first direction.

Figure 17B:
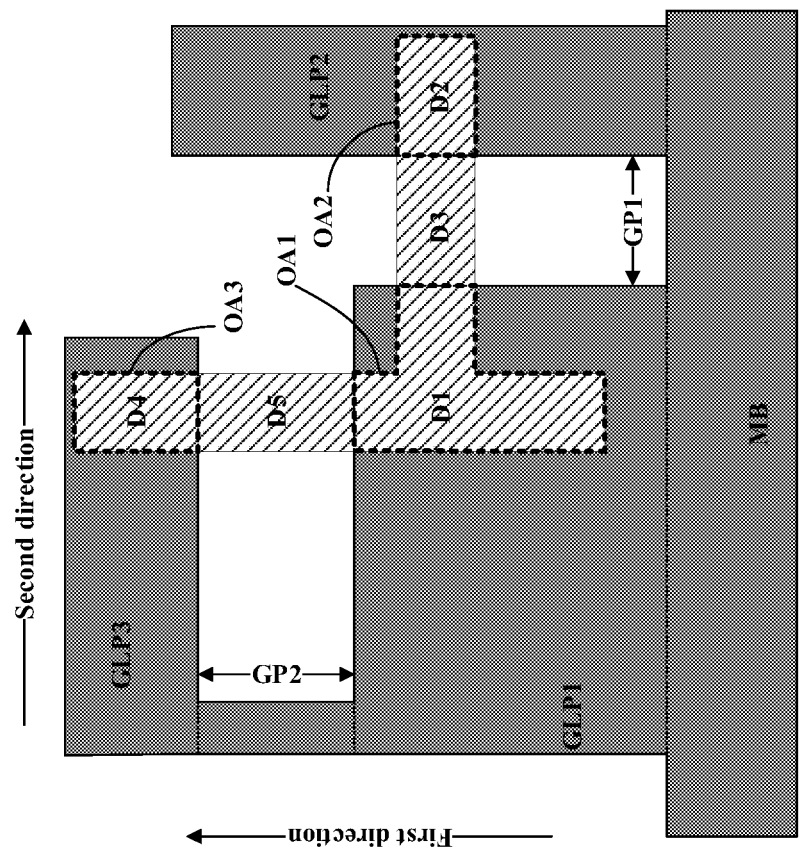
FIG. 17A and FIG. 17B illustrate that a parasitic capacitance formed between a drain electrode and a respective one of the plurality of gate lines remains substantially the same regardless relative positional shift between the drain electrode and the respective one of the plurality of gate lines.
Figure 17A:
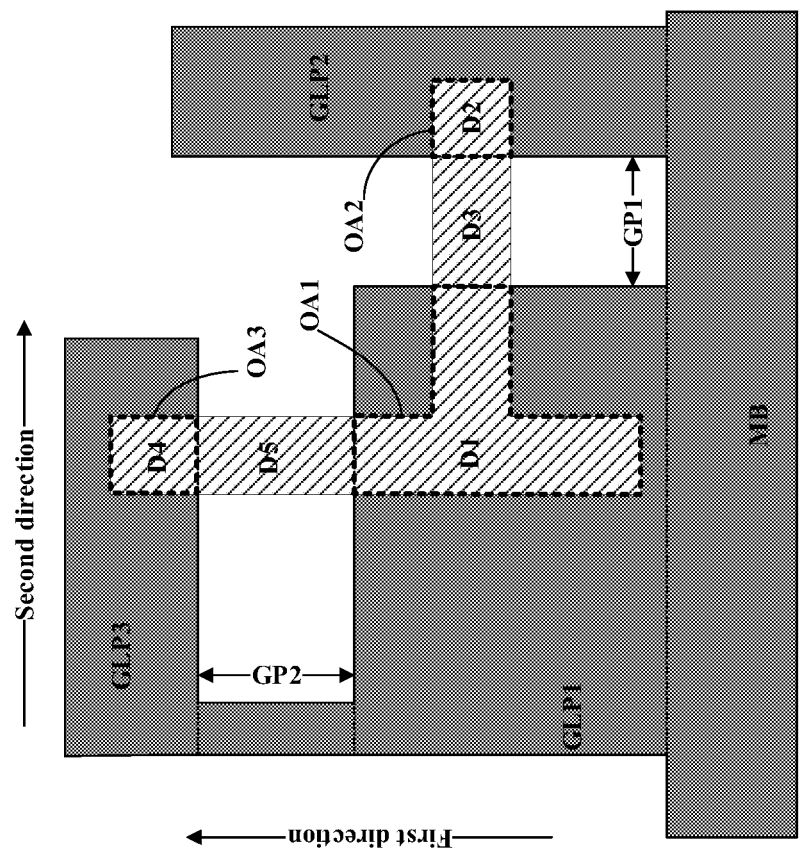

FIG. 17A and FIG. 17B illustrate that a parasitic capacitance formed between a drain electrode and a respective one of the plurality of gate lines remains substantially the same regardless relative positional shift between the drain electrode and the respective one of the plurality of gate lines. Referring to FIG. 17A, a first array substrate is fabricated, the drain electrode D is at a first position relative to the first gate line protrusion GLP1, the second gate line protrusion GLP2, and the third gate line protrusion GLP3; an orthographic projection of the first portion D1 of the drain electrode D on the base substrate overlaps with an orthographic projection of a first gate line protrusion GLP1 of a respective one of the plurality of gate lines on the base substrate, resulting in a first overlapping area OA1; an orthographic projection of the second portion D2 of the drain electrode D on the base substrate overlaps with an orthographic projection of a second gate line protrusion GLP2 of the respective one of the plurality of gate lines on the base substrate, resulting in a second overlapping area OA2; and an orthographic projection of the fourth portion D4 of the drain electrode D on the base substrate overlaps with an orthographic projection of a third gate line protrusion GLP3 of the respective one of the plurality of gate lines on the base substrate, resulting in a third overlapping area OA3. Referring to FIG. 17B, a second array substrate is fabricated, the drain electrode D is at a second position relative to the first gate line protrusion GLP1, the second gate line protrusion GLP2, and the third gate line protrusion GLP3. As shown in FIG. 17A and FIG. 17B, the second position is shifted relative to the first position. Referring to FIG. 17A and FIG. 17B, due to the relative positional shift between the drain electrode D and the first gate line protrusion GLP1, between the drain electrode D and the second gate line protrusion GLP2, and between the drain electrode D and the third gate line protrusion GLP3; the first overlapping area OA1 decreases, the second overlapping area OA2 increases, and the third overlapping area OA3 increases. However, a total overlapping area including the first overlapping area OA1, the second overlapping area OA2, and the third overlapping area OA3, remains substantially the same between the first array substrate and the second array substrate. As a result, the parasitic capacitance between the drain electrode D and a respective one of the plurality of gate lines remains substantially the same.

Referring to FIGS. 2, 6, 10, and 14, in some embodiments, an orthographic projection of the source electrode S on the base substrate at least partially overlaps with the orthographic projection of the first gate line protrusion GLP1 on the base substrate 10, and is non-overlapping with the orthographic projection of the second gate line protrusion GLP2 on the base substrate 10. Referring to FIG. 14, optionally, the orthographic projection of the source electrode S on the base substrate at least partially overlaps with the orthographic projection of the first gate line protrusion GLP1 on the base substrate 10, is non-overlapping with the orthographic projection of the second gate line protrusion GLP2 on the base substrate 10, and is non-overlapping with the orthographic projection of the third gate line protrusion GLP3 on the base substrate 10.

In another aspect, the present disclosure also provide a display apparatus including the array substrate described herein or fabricated by a method described herein, and one or more integrated circuits connected to the array substrate. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

In another aspect, the present disclosure provide a method of fabricating an array substrate having a plurality of subpixels. In some embodiments, the method includes forming a plurality of gate lines and a plurality of data lines crossing over each other on a base substrate. In some embodiments, in a respective one of the plurality of subpixels, the method includes forming a thin film transistor on the base substrate, forming the thin film transistor includes forming a gate electrode, forming a source electrode, and forming a drain electrode. Optionally, the drain electrode is formed to include a first portion, a second portion, and a third portion connecting the first portion and the second portion. Optionally, an orthographic projection of the first portion on the base substrate at least partially overlaps with an orthographic projection of a first gate line protrusion of a respective one of the plurality of gate lines on the base substrate, resulting in a first overlapping area. Optionally, an orthographic projection of the second portion on the base substrate at least partially overlaps with an orthographic projection of a second gate line protrusion of the respective one of the plurality of gate lines on the base substrate, resulting in a second overlapping area. Optionally, an orthographic projection of the third portion on the base substrate is non-overlapping with an orthographic projection of the plurality of gate lines on the base substrate.

In some embodiments, the second gate line protrusion is formed to have a margin along a direction from the first gate line protrusion to the second gate line protrusion. Optionally, the margin abuts an overlapping portion of the second gate line protrusion, an orthographic projection of the overlapping portion of the second gate line protrusion on the base substrate overlaps with the orthographic projection of the second portion on the base substrate. Optionally, the overlapping portion of the second gate line protrusion and the margin are arranged along the direction from the first gate line protrusion to the second gate line protrusion. Optionally, the plurality of gate lines are formed to be arranged along a first direction; the plurality of data lines are formed to be arranged along a second direction; and the direction from the first gate line protrusion to the second gate line protrusion is substantially parallel to one of the first direction and the second direction.

In some embodiments, forming the thin film transistor further includes forming an active layer, the first gate line protrusion is formed to include a gate electrode as an integral portion of the first gate line protrusion. Optionally, an orthographic projection of the gate electrode on the base substrate at least partially overlaps with an orthographic projection of the active layer on the base substrate. Optionally, the orthographic projection of the second gate line protrusion on the base substrate is non-overlapping with the orthographic projection of the active layer on the base substrate.

In some embodiments, forming the drain electrode further includes forming a fourth portion and a fifth portion. Optionally, an orthographic projection of the fourth portion on the base substrate at least partially overlaps with an orthographic projection of a third gate line protrusion of the respective one of the plurality of gate lines on the base substrate. Optionally, an orthographic projection of the fifth portion on the base substrate is non-overlapping with the orthographic projection of the plurality of gate lines on the base substrate.

In some embodiments, the second gate line protrusion is formed to have a first margin along a direction from the first gate line protrusion to the second gate line protrusion; and the third gate line protrusion is formed to have a second margin along a direction from the first gate line protrusion to the third gate line protrusion. Optionally, the first margin abuts a first overlapping portion of the second gate line protrusion, wherein an orthographic projection of the first overlapping portion of the second gate line protrusion on the base substrate overlaps with the orthographic projection of the second portion on the base substrate. Optionally, the second margin abuts a second overlapping portion of the third gate line protrusion, wherein an orthographic projection of the second overlapping portion of the third gate line protrusion on the base substrate overlaps with the orthographic projection of the fourth portion on the base substrate. Optionally, the first overlapping portion of the second gate line protrusion and the first margin are arranged along the direction from the first gate line protrusion to the second gate line protrusion. Optionally, the second overlapping portion of the third gate line protrusion and the second margin are arranged along the direction from the first gate line protrusion to the third gate line protrusion. Optionally, the plurality of gate lines are formed to be arranged along a first direction; the plurality of data lines are formed to be arranged along a second direction; the direction from the first gate line protrusion to the second gate line protrusion is substantially parallel to the first direction; and the direction from the first gate line protrusion to the third gate line protrusion is substantially parallel to the second direction.

In some embodiments, forming the thin film transistor further includes forming an active layer. Optionally, the first gate line protrusion is formed to include a gate electrode as an integral portion of the first gate line protrusion. Optionally, an orthographic projection of the gate electrode on the base substrate at least partially overlaps with an orthographic projection of the active layer on the base substrate. Optionally, orthographic projections of the second gate line protrusion and the third gate line protrusion on the base substrate are non-overlapping with the orthographic projection of the active layer on the base substrate.

In some embodiments, in the respective one of the plurality of subpixels, the method further includes forming a pixel electrode; and forming a passivation layer, the passivation layer formed between the pixel electrode and the drain electrode. Optionally, the pixel electrode is formed to extend through the passivation layer to electrically connected to the third portion of the drain electrode. In one example, the method includes, prior to forming the pixel electrode, forming a via extending through the passivation layer, and the pixel electrode is formed to be connected to the third portion of the drain electrode through the via extending through the passivation layer.

In some embodiments, in the respective one of the plurality of subpixels, the method further includes forming a pixel electrode; and forming a passivation layer, the passivation layer formed between the pixel electrode and the drain electrode. Optionally, the pixel electrode is formed to extend through the passivation layer to electrically connected to the second portion of the drain electrode. In one example, the method includes, prior to forming the pixel electrode, forming a via extending through the passivation layer, and the pixel electrode is formed to be connected to the second portion of the drain electrode through the via extending through the passivation layer.

In some embodiments, in the respective one of the plurality of subpixels, the method further includes forming a pixel electrode; and forming a passivation layer, the passivation layer formed between the pixel electrode and the drain electrode. Optionally, the pixel electrode is formed to extend through the passivation layer to electrically connected to the third portion of the drain electrode and the fifth portion of the drain electrode, respectively. In one example, the method includes, prior to forming the pixel electrode, forming a first via and a second via respectively extending through the passivation layer, and the pixel electrode is formed to be connected to the third portion of the drain electrode through the first via extending through the passivation layer; and is connected to the fifth portion of the drain electrode through the second via extending through the passivation layer.

Optionally, an orthographic projection of the source electrode on the base substrate at least partially overlaps with the orthographic projection of the first gate line protrusion on the base substrate, and is non-overlapping with the orthographic projection of the second gate line protrusion on the base substrate.

In some embodiments, the first gate line protrusion, the second gate line protrusion, and a main body of the respective one of the plurality of gate lines on the base substrate are formed as parts of a unitary structure. Optionally, the first gate line protrusion and the second gate line protrusion are respectively connected to the main body of the respective one of the plurality of gate lines. Optionally, the first gate line protrusion and the second gate line protrusion are spaced apart by a gap. Optionally, the third portion is at least partially in a region corresponding to the gap.

In some embodiments, the first gate line protrusion, the second gate line protrusion, the third gate line protrusion, and a main body of the respective one of the plurality of gate lines on the base substrate are formed as parts of a unitary structure. Optionally, the first gate line protrusion, the second gate line protrusion, and the third gate line protrusion are respectively connected to the main body of the respective one of the plurality of gate lines. Optionally, the first gate line protrusion and the second gate line protrusion are spaced apart by a first gap. Optionally, the first gate line protrusion and the third gate line protrusion are spaced apart by a second gap. Optionally, the third portion is at least partially in a region corresponding to the first gap; and the fifth portion is at least partially in a region corresponding to the second gap.

In another aspect, the present disclosure provides a method of fabricating a first array substrate and a second array substrate, each of which is fabricated according to the method described above. In the present method, the first array substrate and the second array substrate are fabricated to have a substantially the same parasitic capacitance between the drain electrode D and a respective one of the plurality of gate lines, regardless relative positional shift between the drain electrode D and the respective one of the plurality of gate lines GL during fabricating the first array substrate and during fabricating the second array substrate, e.g., due to the alignment error of a mask plate used in fabricating the drain electrode. As a result, characteristics of the thin film transistors in the first array substrate and in the second array substrate also remain substantially unchanged, e.g., substantially free of adverse effects resulting from a change in the parasitic capacitance.

Figure 18A:
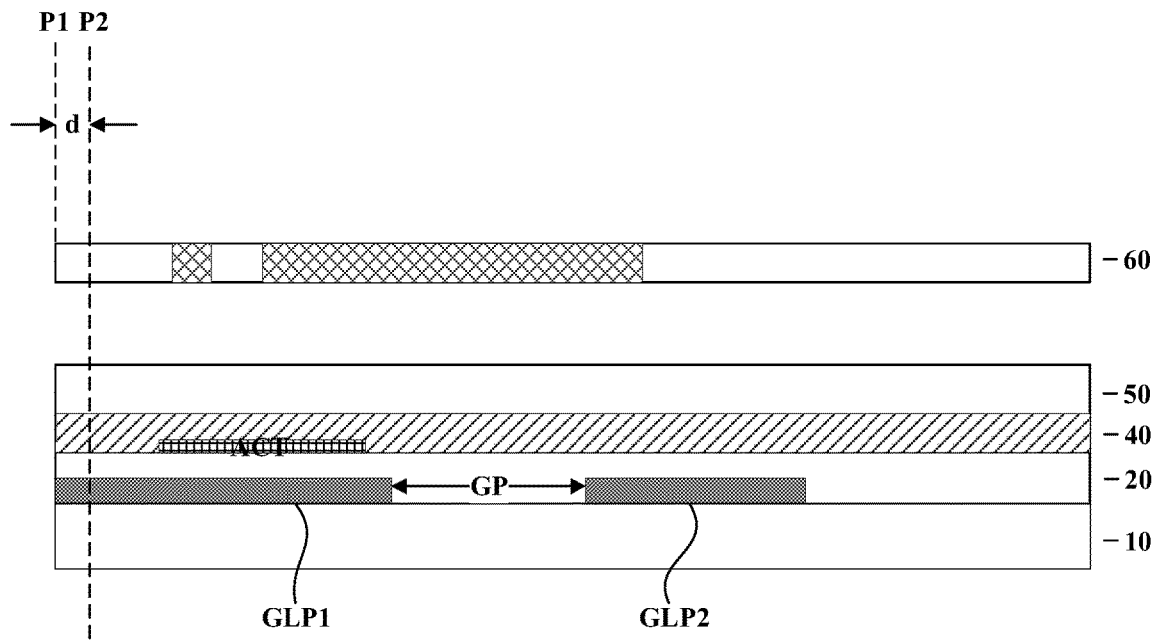
FIG. 18A and FIG. 18B illustrate a process of fabricating a first array substrate and a second array substrate in some embodiments according to the present disclosure.
Figure 18B:
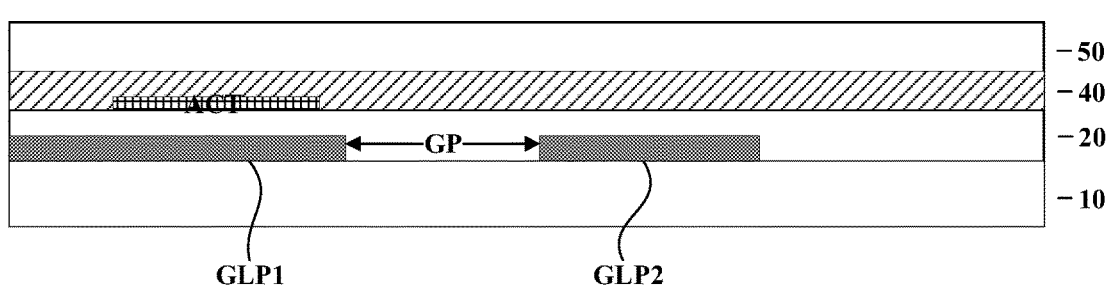

FIG. 18A and FIG. 18B illustrate a process of fabricating a first array substrate and a second array substrate in some embodiments according to the present disclosure. Referring to FIG. 18A and FIG. 18B, subsequent to forming the gate insulating layer 20, a conductive material layer 40 is formed on a side of the gate insulating layer 20 away from the base substrate 10, and a photoresist layer 50 is formed on a side of the conductive material layer 40 away from the base substrate 10. The conductive material layer 40 is patterned to form the drain electrode and the source electrode. A mask plate 60 is used to expose the photoresist layer 50. As shown in FIG. 18A and FIG. 18B, the mask plate 60 is aligned at a first position P1 during fabricating the first array substrate, and is aligned at a second position P2 during fabricating the second array substrate. The second position P2 is different from the first position P1 and is offset from the first position P1 by a distance d equal to or smaller than a threshold value.

Regardless the relative positional shift between the first position P1 and the second position P2, in some embodiments, a total overlapping area including the first overlapping area OA1 and the second overlapping area OA2 is substantially the same during fabricating the first array substrate and during fabricating the second array substrate, as demonstrated in FIGS. 4A, 4B, 8A, 8B, 12A, and 12B. Optionally, a total overlapping area including the first overlapping area OA1, the second overlapping area OA2, and the third overlapping area OA3, is substantially the same during fabricating the first array substrate and during fabricating the second array substrate, as demonstrated in FIG. 17A and FIG. 17B.

In some embodiments, and referring to FIGS. 4A, 4B, 8A, 8B, 12A, and 12B, in fabricating the first array substrate, the second gate line protrusion GLP2 has a margin M along a direction from the first gate line protrusion GLP1 to the second gate line protrusion GLP2. The margin M abuts an overlapping portion of the second gate line protrusion GLP2. An orthographic projection of the overlapping portion of the second gate line protrusion GLP2 on the base substrate overlaps with the orthographic projection of the second portion D2 on the base substrate. The overlapping portion of the second gate line protrusion GLP2 and the margin M are arranged along the direction from the first gate line protrusion GLP1 to the second gate line protrusion GLP2. Optionally, the threshold value is a length of the margin M along the direction from the first gate line protrusion GLP1 to the second gate line protrusion GLP2.

In some embodiments, and referring to FIG. 17A and FIG. 17B, in fabricating the first array substrate, the second gate line protrusion GLP2 has a first margin M1 along a direction from the first gate line protrusion GLP1 to the second gate line protrusion GLP2, and a second margin M2 along a direction from the first gate line protrusion GLP1 to the third gate line protrusion GLP3. The first margin M1 abuts an overlapping portion of the second gate line protrusion GLP2. An orthographic projection of the overlapping portion of the second gate line protrusion GLP2 on the base substrate overlaps with the orthographic projection of the second portion D2 on the base substrate. The second margin M2 abuts an overlapping portion of the third gate line protrusion GLP3. An orthographic projection of the overlapping portion of the third gate line protrusion GLP3 on the base substrate overlaps with the orthographic projection of the fourth portion D4 on the base substrate. The overlapping portion of the second gate line protrusion GLP2 and the first margin M1 are arranged along the direction from the first gate line protrusion GLP1 to the second gate line protrusion GLP2. The overlapping portion of the third gate line protrusion GLP3 and the second margin M2 are arranged along the direction from the first gate line protrusion GLP1 to the third gate line protrusion GLP3. Optionally, the threshold value is a length of the first margin M1 along the direction from the first gate line protrusion GLP1 to the second gate line protrusion GLP2. Optionally, the threshold value is a length of the second margin M2 along the direction from the first gate line protrusion GLP1 to the third gate line protrusion GLP3. Optionally, a first component of the threshold value along the second direction is a length of the first margin M1 along the direction from the first gate line protrusion GLP1 to the second gate line protrusion GLP2; and a second component of the threshold value along the first direction is a length of the second margin M2 along the direction from the first gate line protrusion GLP1 to the third gate line protrusion GLP3.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a plurality of subpixels, comprising a plurality of gate lines and a plurality of data lines crossing over each other;
   wherein, in a respective one of the plurality of subpixels, the array substrate comprises:
   a base substrate; and
   a thin film transistor on the base substrate, and comprising a gate electrode, a source electrode, a drain electrode, and an active layer;
   wherein the drain electrode comprises a first portion, a second portion, a third portion connecting the first portion and the second portion, a fourth portion, and a fifth portion;
   an orthographic projection of the first portion on the base substrate at least partially overlaps with an orthographic projection of a first gate line protrusion of a respective one of the plurality of gate lines on the base substrate;
   an orthographic projection of the second portion on the base substrate at least partially overlaps with an orthographic projection of a second gate line protrusion of the respective one of the plurality of gate lines on the base substrate;
   an orthographic projection of the third portion on the base substrate is non-overlapping with an orthographic projection of the plurality of gate lines on the base substrate;
   an orthographic projection of the fourth portion on the base substrate at least partially overlaps with an orthographic projection of a third gate line protrusion of the respective one of the plurality of gate lines on the base substrate;
   an orthographic projection of the fifth portion on the base substrate is non-overlapping with the orthographic projection of the plurality of gate lines on the base substrate;
   the first gate line protrusion comprises the gate electrode as an integral portion;
   an orthographic projection of the gate electrode on the base substrate at least partially overlaps with an orthographic projection of the active layer on the base substrate; and
   the orthographic projections of the second gate line protrusion and the third gate line protrusion on the base substrate are non-overlapping with the orthographic projection of the active layer on the base substrate.

2. The array substrate of claim 1, wherein the second gate line protrusion has a margin along a direction from the first gate line protrusion to the second gate line protrusion;
   the margin abuts an overlapping portion of the second gate line protrusion, wherein an orthographic projection of the overlapping portion of the second gate line protrusion on the base substrate overlaps with the orthographic projection of the second portion on the base substrate; and the overlapping portion of the second gate line protrusion and the margin are arranged along the direction from the first gate line protrusion to the second gate line protrusion.

3. The array substrate of claim 2, wherein the plurality of gate lines are arranged along a first direction;

the plurality of data lines are arranged along a second direction; and the direction from the first gate line protrusion to the second gate line protrusion is substantially parallel to one of the first direction and the second direction.

4. The array substrate of claim 1, wherein the second gate line protrusion has a first margin along a direction from the first gate line protrusion to the second gate line protrusion;

the third gate line protrusion has a second margin along a direction from the first gate line protrusion to the third gate line protrusion;

the first margin abuts a first overlapping portion of the second gate line protrusion, wherein an orthographic projection of the first overlapping portion of the second gate line protrusion on the base substrate overlaps with the orthographic projection of the second portion on the base substrate;

the second margin abuts a second overlapping portion of the third gate line protrusion, wherein an orthographic projection of the second overlapping portion of the third gate line protrusion on the base substrate overlaps with the orthographic projection of the fourth portion on the base substrate;

the first overlapping portion of the second gate line protrusion and the first margin are arranged along the direction from the first gate line protrusion to the second gate line protrusion; and the second overlapping portion of the third gate line protrusion and the second margin are arranged along the direction from the first gate line protrusion to the third gate line protrusion.

5. The array substrate of claim 4, wherein the plurality of gate lines are arranged along a first direction;

the plurality of data lines are arranged along a second direction;

the direction from the first gate line protrusion to the third gate line protrusion is substantially parallel to the first direction; and the direction from the first gate line protrusion to the second gate line protrusion is substantially parallel to the second direction.

6. The array substrate of claim 1, wherein, in the respective one of the plurality of subpixels, the array substrate further comprises:

a pixel electrode; and a passivation layer between the pixel electrode and the drain electrode;

wherein the pixel electrode extends through the passivation layer to electrically connect to the third portion of the drain electrode.

7. The array substrate of claim 1, wherein, in the respective one of the plurality of subpixels, the array substrate further comprises:

a pixel electrode; and a passivation layer between the pixel electrode and the drain electrode;

wherein the pixel electrode extends through the passivation layer to electrically connect to the second portion of the drain electrode.

8. The array substrate of claim 5, wherein, in the respective one of the plurality of subpixels, the array substrate further comprises:

a pixel electrode; and a passivation layer between the pixel electrode and the drain electrode;

wherein the pixel electrode extends through the passivation layer to electrically connect to the third portion of the drain electrode and the fifth portion of the drain electrode, respectively.

9. The array substrate of claim 1, wherein an orthographic projection of the source electrode on the base substrate at least partially overlaps with the orthographic projection of the first gate line protrusion on the base substrate, and is non-overlapping with the orthographic projection of the second gate line protrusion on the base substrate.

10. The array substrate of claim 1, wherein the first gate line protrusion, the second gate line protrusion, and a main body of the respective one of the plurality of gate lines on the base substrate are parts of a unitary structure;

the first gate line protrusion and the second gate line protrusion are respectively connected to the main body of the respective one of the plurality of gate lines; and the first gate line protrusion and the second gate line protrusion are spaced apart by a gap.

11. The array substrate of claim 10, wherein the third portion is at least partially in a region corresponding to the gap.

12. The array substrate of claim 1, wherein the first gate line protrusion, the second gate line protrusion, the third gate line protrusion, and a main body of the respective one of the plurality of gate lines on the base substrate are parts of a unitary structure;

the first gate line protrusion, the second gate line protrusion, and the third gate line protrusion are respectively connected to the main body of the respective one of the plurality of gate lines;

the first gate line protrusion and the second gate line protrusion are spaced apart by a first gap; and the first gate line protrusion and the third gate line protrusion are spaced apart by a second gap.

13. The array substrate of claim 12, wherein the third portion is at least partially in a region corresponding to the first gap; and the fifth portion is at least partially in a region corresponding to the second gap.

14. A display apparatus, comprising the array substrate of claim 1, and one or more integrated circuits connected to the array substrate.

15. A method of fabricating an array substrate having a plurality of subpixels, comprising forming a plurality of gate lines and a plurality of data lines crossing over each other;

wherein, in a respective one of the plurality of subpixels, the method comprises forming a thin film transistor on a base substrate;

wherein forming the thin film transistor comprises forming a gate electrode, forming a source electrode, forming a drain electrode, and forming an active layer;

wherein the drain electrode is formed to comprise a first portion, a second portion, a third portion connecting the first portion and the second portion, a fourth portion, and a fifth portion;

an orthographic projection of the first portion on the base substrate at least partially overlaps with an orthographic projection of a first gate line protrusion of a respective one of the plurality of gate lines on the base substrate, resulting in a first overlapping area;

an orthographic projection of the second portion on the base substrate at least partially overlaps with an orthographic projection of a second gate line protrusion of the respective one of the plurality of gate lines on the base substrate, resulting in a second overlapping area;

an orthographic projection of the third portion on the base substrate is non-overlapping with an orthographic projection of the plurality of gate lines on the base substrate;

an orthographic projection of the fourth portion on the base substrate at least partially overlaps with an orthographic projection of a third gate line protrusion of the respective one of the plurality of gate lines on the base substrate;

an orthographic projection of the fifth portion on the base substrate is non-overlapping with the orthographic projection of the plurality of gate lines on the base substrate;

the first gate line protrusion comprises the gate electrode as an integral portion;

an orthographic projection of the gate electrode on the base substrate at least partially overlaps with an orthographic projection of the active layer on the base substrate; and the orthographic projections of the second gate line protrusion and the third gate line protrusion on the base substrate are non-overlapping with the orthographic projection of the active layer on the base substrate.

16. A method of fabricating a first array substrate and a second array substrate, each of which is fabricated according to the method of claim 15;

wherein a mask plate for patterning the drain electrode is aligned at a first position during fabricating the first array substrate, and is aligned at a second position during fabricating the second array substrate;

the second position is different from the first position and is offset from the first position by a distance equal to or smaller than a threshold value; and a total overlapping area comprising the first overlapping area and the second overlapping area is substantially the same during fabricating the first array substrate and during fabricating the second array substrate.

17. The method of claim 16, wherein, in the first array substrate, the second gate line protrusion has a margin along a direction from the first gate line protrusion to the second gate line protrusion;

the margin abuts an overlapping portion of the second gate line protrusion, wherein an orthographic projection of the overlapping portion of the second gate line protrusion on the base substrate overlaps with the orthographic projection of the second portion on the base substrate;

the overlapping portion of the second gate line protrusion and the margin are arranged along the direction from the first gate line protrusion to the second gate line protrusion; and the threshold value is a length of the margin along the direction from the first gate line protrusion to the second gate line protrusion.

* * * * *